United States Patent
Lung et al.

(10) Patent No.: US 8,933,536 B2
(45) Date of Patent: Jan. 13, 2015

(54) POLYSILICON PILLAR BIPOLAR TRANSISTOR WITH SELF-ALIGNED MEMORY ELEMENT

(75) Inventors: Hsiang-Lan Lung, Elmsford, NY (US);
Erh-Kun Lai, Elmsford, NY (US);
Chung H. Lam, Peekskill, NY (US);
Bipin Rajendran, White Plains, NY (US)

(73) Assignees: Macronix International Co., Ltd., Hsinchu (TW); International Business Machines Corporation, Armonk, NY (US)

( * ) Notice: Subject to any disclaimer, the term of this patent is extended or adjusted under 35 U.S.C. 154(b) by 1050 days.

(21) Appl. No.: 12/357,912

(22) Filed: Jan. 22, 2009

(65) Prior Publication Data

US 2010/0181649 A1    Jul. 22, 2010

(51) Int. Cl.
*H01L 27/082* (2006.01)
*H01L 27/102* (2006.01)
*H01L 27/24* (2006.01)
*H01L 45/00* (2006.01)

(52) U.S. Cl.
CPC ........ *H01L 27/1026* (2013.01); *H01L 27/2445* (2013.01); *H01L 27/2463* (2013.01); *H01L 45/04* (2013.01); *H01L 45/06* (2013.01); *H01L 45/085* (2013.01); *H01L 45/1233* (2013.01); *H01L 45/1246* (2013.01); *H01L 45/142* (2013.01); *H01L 45/144* (2013.01); *H01L 45/146* (2013.01); *H01L 45/147* (2013.01); *H01L 45/1616* (2013.01); *H01L 45/1625* (2013.01); *H01L 45/1683* (2013.01)
USPC ........... 257/586; 257/295; 257/374; 257/571; 257/587; 257/623

(58) Field of Classification Search
USPC ........ 257/295, 373, 571, 586, 587, 618, 623, 257/626, 374, 565
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii et al. |
| 4,876,220 A | 10/1989 | Mohsen et al. |

(Continued)

OTHER PUBLICATIONS

"Magnetic Bit Boost," www.sciencenews.org, Dec. 18 & 25, 2004, p. 389, vol. 166.

(Continued)

*Primary Examiner* — Ori Nadav
(74) *Attorney, Agent, or Firm* — Haynes Beffel & Wolfeld LLP

(57) ABSTRACT

Memory cells having memory elements self-aligned with the emitters of bipolar junction transistor access devices are described herein, as well as methods for manufacturing such devices. A memory device as described herein comprises a plurality of memory cells. Memory cells in the plurality of memory cells include a bipolar junction transistor comprising an emitter comprising a pillar of doped polysilicon. The memory cells include an insulating element over the emitter and having an opening extending through the insulating layer, the opening centered over the emitter. The memory cells also include a memory element within the opening and electrically coupled to the emitter.

12 Claims, 35 Drawing Sheets

(56) References Cited

U.S. PATENT DOCUMENTS

| | | | |
|---|---|---|---|
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,751,012 A | 5/1998 | Wolstenholme et al. |
| 5,754,472 A | 5/1998 | Sim et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A * | 11/2000 | Wolstenholme et al. ......... 257/3 |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,429,065 B2 * | 8/2002 | Forbes ........................ 438/238 |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,838,692 B1 | 1/2005 | Lung et al. |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen et al. |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,099,180 B1 | 8/2006 | Dodge et al. |

(56) References Cited

U.S. PATENT DOCUMENTS

| | | |
|---|---|---|
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,126,847 B2 | 10/2006 | Ha et al. |
| 7,132,675 B2 | 11/2006 | Gilton |
| 7,151,273 B2 | 12/2006 | Campbell et al. |
| 7,154,774 B2 | 12/2006 | Bedeschi et al. |
| 7,158,411 B2 | 1/2007 | Yeh et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung et al. |
| 7,208,751 B2 | 4/2007 | Ooishi et al. |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |
| 7,269,052 B2 | 9/2007 | Segal et al. |
| 7,277,317 B2 | 10/2007 | Le Phan et al. |
| 7,291,556 B2 | 11/2007 | Choi et al. |
| 7,309,630 B2 | 12/2007 | Fan et al. |
| 7,321,130 B2 | 1/2008 | Lung et al. |
| 7,323,708 B2 | 1/2008 | Lee et al. |
| 7,323,734 B2 | 1/2008 | Ha et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,385 B2 | 4/2008 | Abbott |
| 7,379,328 B2 | 5/2008 | Osada et al. |
| 7,385,235 B2 | 6/2008 | Lung et al. |
| 7,388,273 B2 | 6/2008 | Burr et al. |
| 7,394,088 B2 | 7/2008 | Lung |
| 7,397,060 B2 | 7/2008 | Lung |
| 7,400,522 B2 | 7/2008 | Toda et al. |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 7,473,576 B2 | 1/2009 | Lung |
| 7,479,649 B2 | 1/2009 | Lung |
| 7,485,891 B2 | 2/2009 | Hamann et al. |
| 7,502,252 B2 | 3/2009 | Fuji et al. |
| 7,507,986 B2 | 3/2009 | Lung |
| 7,514,334 B2 | 4/2009 | Chen et al. |
| 7,514,705 B2 | 4/2009 | Breitwisch et al. |
| 7,515,461 B2 | 4/2009 | Happ et al. |
| 7,651,906 B2 * | 1/2010 | Park et al. .................... 438/237 |
| 7,858,960 B2 * | 12/2010 | Chang .............................. 257/2 |
| 8,369,139 B2 * | 2/2013 | Liu et al. ......................... 365/163 |
| 2002/0070457 A1 | 6/2002 | Sun et al. |
| 2002/0113273 A1 | 8/2002 | Hwang et al. |
| 2003/0072195 A1 | 4/2003 | Mikolajick |
| 2003/0095426 A1 | 5/2003 | Hush et al. |
| 2003/0186481 A1 | 10/2003 | Lung |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0029587 A1 | 2/2005 | Harshfield |
| 2005/0052904 A1 | 3/2005 | Cho et al. |
| 2005/0062087 A1 | 3/2005 | Chen et al. |
| 2005/0093022 A1 | 5/2005 | Lung |
| 2005/0127349 A1 | 6/2005 | Horak et al. |
| 2005/0141261 A1 | 6/2005 | Ahn |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0195633 A1 | 9/2005 | Choi et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2005/0270832 A1 | 12/2005 | Chu et al. |
| 2006/0006472 A1 | 1/2006 | Jiang |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157681 A1 | 7/2006 | Chen et al. |
| 2006/0163554 A1 | 7/2006 | Lankhorst et al. |
| 2006/0172067 A1 | 8/2006 | Ovshinsky et al. |
| 2006/0175599 A1 | 8/2006 | Happ |
| 2006/0186483 A1 | 8/2006 | Cho |
| 2006/0198183 A1 | 9/2006 | Kawahara et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0245236 A1 | 11/2006 | Zaidi |
| 2006/0250885 A1 | 11/2006 | Cho et al. |
| 2006/0261392 A1 | 11/2006 | Lee et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284237 A1 | 12/2006 | Park et al. |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289847 A1 | 12/2006 | Dodge |
| 2006/0289848 A1 | 12/2006 | Dennison |
| 2007/0007613 A1 | 1/2007 | Wang et al. |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0040159 A1 | 2/2007 | Wang |
| 2007/0096162 A1 | 5/2007 | Happ et al. |
| 2007/0096248 A1 | 5/2007 | Philipp et al. |
| 2007/0103963 A1 | 5/2007 | Kim et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |

(56) References Cited

U.S. PATENT DOCUMENTS

| | | | |
|---|---|---|---|
| 2007/0156949 | A1 | 7/2007 | Rudelic et al. |
| 2007/0158632 | A1 | 7/2007 | Ho |
| 2007/0158633 | A1 | 7/2007 | Lai et al. |
| 2007/0158645 | A1 | 7/2007 | Lung |
| 2007/0158690 | A1 | 7/2007 | Ho et al. |
| 2007/0158862 | A1 | 7/2007 | Lung |
| 2007/0161186 | A1 | 7/2007 | Ho |
| 2007/0170881 | A1 | 7/2007 | Noh et al. |
| 2007/0173019 | A1 | 7/2007 | Ho et al. |
| 2007/0173063 | A1 | 7/2007 | Lung |
| 2007/0176251 | A1 | 8/2007 | Oh et al. |
| 2007/0176261 | A1 | 8/2007 | Lung |
| 2007/0187664 | A1 | 8/2007 | Happ |
| 2007/0201267 | A1 | 8/2007 | Happ et al. |
| 2007/0215852 | A1 | 9/2007 | Lung |
| 2007/0224726 | A1 | 9/2007 | Chen et al. |
| 2007/0235811 | A1 | 10/2007 | Furukawa et al. |
| 2007/0236989 | A1 | 10/2007 | Lung |
| 2007/0246699 | A1 | 10/2007 | Lung |
| 2007/0249090 | A1 | 10/2007 | Philipp et al. |
| 2007/0257300 | A1 | 11/2007 | Ho et al. |
| 2007/0262388 | A1 | 11/2007 | Ho et al. |
| 2007/0267618 | A1 | 11/2007 | Zaidi et al. |
| 2007/0274121 | A1 | 11/2007 | Lung et al. |
| 2007/0285960 | A1 | 12/2007 | Lung et al. |
| 2007/0298535 | A1 | 12/2007 | Lung |
| 2008/0006811 | A1 | 1/2008 | Philipp et al. |
| 2008/0012000 | A1 | 1/2008 | Harshfield |
| 2008/0014676 | A1 | 1/2008 | Lung et al. |
| 2008/0025089 | A1 | 1/2008 | Scheuerlein et al. |
| 2008/0043520 | A1 | 2/2008 | Chen |
| 2008/0094871 | A1 | 4/2008 | Parkinson |
| 2008/0101110 | A1 | 5/2008 | Happ et al. |
| 2008/0137400 | A1 | 6/2008 | Chen et al. |
| 2008/0138929 | A1 | 6/2008 | Lung |
| 2008/0138930 | A1 | 6/2008 | Lung |
| 2008/0138931 | A1 | 6/2008 | Lung |
| 2008/0164453 | A1 | 7/2008 | Breitwisch et al. |
| 2008/0165569 | A1 | 7/2008 | Chen et al. |
| 2008/0165570 | A1 | 7/2008 | Happ et al. |
| 2008/0165572 | A1 | 7/2008 | Lung |
| 2008/0166875 | A1 | 7/2008 | Lung |
| 2008/0179582 | A1 | 7/2008 | Burr et al. |
| 2008/0180990 | A1 | 7/2008 | Lung |
| 2008/0186755 | A1 | 8/2008 | Lung et al. |
| 2008/0191187 | A1 | 8/2008 | Lung et al. |
| 2008/0192534 | A1 | 8/2008 | Lung |
| 2008/0197334 | A1 | 8/2008 | Lung |
| 2008/0224119 | A1 | 9/2008 | Burr et al. |
| 2008/0225489 | A1 | 9/2008 | Cai et al. |
| 2008/0265234 | A1 | 10/2008 | Breitwisch et al. |
| 2009/0001341 | A1 | 1/2009 | Breitwisch et al. |
| 2009/0014704 | A1 | 1/2009 | Chen et al. |
| 2009/0023242 | A1 | 1/2009 | Lung |
| 2009/0027950 | A1 | 1/2009 | Lam et al. |
| 2009/0042335 | A1 | 2/2009 | Lung |
| 2009/0057641 | A1 | 3/2009 | Lung |
| 2009/0098678 | A1 | 4/2009 | Lung |
| 2009/0166600 | A1 | 7/2009 | Park et al. |
| 2009/0166603 | A1 | 7/2009 | Lung |

OTHER PUBLICATIONS

"New Memories Tap Spin, Gird for Battle," Science News, Apr. 3, 1999, p. 223, vol. 155.
"Optimized Thermal Capacitance in a Phase Change Memory Cell Design," IPCOM000141986D, IP.com Prior Art Database, Oct. 18, 2006, 4pp.
"Remembering on the Cheap," www.sciencenews.org, Mar. 19, 2005, p. 189, vol. 167.
"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM 2004, pp. 907-910.
Ahn, S. J. et al., "Highly Reliable 5nm Contact Cell Technology for 256Mb PRAM," VLSI Technology, Digest of Technical Papers, Jun. 14-16, 2005, pp. 98-99.
Atwood, G, et al., "90 nm Phase Change Technology with u Trench and Lance Cell Elements," VLSI Technology, Systems and Applications, Apr. 23-25, 2007, pp. 1-2.
Axon Technologies Corporation paper: Technology Description, published in 1997, pp. 1-6.
Bedeschi, F. et al., "4-MB MOSFET-Selected Phase-Change Memory Experimental Chip," IEEE, 2004, 4 PP.
Blake thesis, "Investigation of GeTeSb5 Chalcogenide Films for Use as an Analog Memory," AFIT/GE/ENG/00M-04, Mar. 2000, 121 pages.
Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.
Chen, An et al., "Non-Volatile Resistive Switching for Advanced Memory Applications," IEEE IEDM, Dec. 5-7, 2005, 4 pp.
Cho, S. L. et al., "Highly Scalable On-axis Confined Cell Structure for High Density PRAM beyond 256Mb," 2005 Symposium on VLSI Technology Digest of Technical Papers, pp. 96-97.
Gibson, G. A. et al., "Phase-change Recording Medium that Enables Ultrahigh-density Electron-beam Data Storage," Applied Physics Letter, 2005, 3 pp., vol. 86.
Gilbert, N.E., "A macro model of programmable metallization cell devices," Solid-State Electronics 49 (2005) 1813-1819.
Gill, Manzur et al., "A High-Performance Nonvolatile Memory Technology for Stand-Alone Memory and Embedded Applications," 2002 IEEE-ISSCC Technical Digest (TD 12.4), 7 pp.
Gleixner, "Phase Change Memory Reliability", 22nd NVSMW, Aug. 26, 2007, 46 pages.
Ha, Y. H. et al., "An Edge Contact Type Cell for Phase Change RAM Featuring Very Low Power Consumption," 2003 Symposium on VLSI Technology Digest of Technical Papers, pp. 175-176.
Hanzawa, Satoru, et al., "A 512kB Embedded Phase Change Memory with 416kB/s Write Throughput at 100μA Cell Write Current," ISSCC 2007, Session 26, Non-Volatile Memories/26.2, 3 pages.
Happ, T. D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Horii, H. et al., "A Novel Cell Technology Using N-doped GeSbTe Films for Phase Change RAM," 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.
Kim, Kinam et al., "Reliability Investigations for Manufacturable High Density PRAM," IEEE 43rd Annual International Reliability Physics Symposium, San Jose, 2005, pp. 157-162.
Kojima, Rie et al., "Ge—Sn—Sb—Te Phase-change Recording Material Having High Crystallization Speed," Proceedings of PCOS 2000, pp. 36-41.
Lacita, A. L., "Electrothermal and Phase-change Dynamics in Chalcogenide-based Memories," IEEE IEDM 2004, 4 pp.

(56) References Cited

OTHER PUBLICATIONS

Lai, Stefan, "Current Status of the Phase Change Memory and Its Future," IEEE IEDM 2003, pp. 255-258.

Lai, Stephan et al., "OUM-A 180 nm Nonvolatile Memory Cell Element Technology for Stand Alone and Embedded Applications," IEEE IEDM 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Lee, J.I., et al., "Highly Scalable Phase Change Memory with CVD GeSbTe for Sub 50nm Genreation," 2007 Symp on VLSI Tech. Digest of Technical Papers, pp. 102-103.

Mott, Nevill, "Electrons in Glass," Nobel Lecture, Dec. 8, 1977, Physics, 1977, pp. 403-413.

Oh, Hyung-Rok, et al., "Enhanced Write Performance of a 64Mb Phase-Change Random Access Memory," ISSCC 2005, Session 2, Non-Volatile Memory, 2.3, 3 pages.

Oh, J.H., et al. "Full Integration of Highly Manufacturable 512Mb PRAM based on 90nm Technology," International Electron Devices Meeting, 2006. Dec. 11-13, 2006 pp. 1-4.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20 high%20density%20high%20performance%20-phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge—Sb—Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates, " Mat. Res. Soc. Symp. Proc., vol. 106, 1998, pp. 21-26.

\* cited by examiner

POLYSILICON PILLAR BIPOLAR TRANSISTOR WITH SELF-ALIGNED MEMORY ELEMENT

CROSS-REFERENCE TO RELATED APPLICATIONS

This application is related to U.S. patent application Ser. No. 12/353,219, entitled "Polysilicon Plug Bipolar Transistor for Phase Change Memory," filed on 13 Jan. 2009, now U.S. Pat. No. 8,030,635.

PARTIES TO A JOINT RESEARCH AGREEMENT

International Business Machines Corporation, a New York corporation, and Macronix International Corporation, Ltd., a Taiwan corporation, are parties to a Joint Research Agreement.

BACKGROUND OF THE INVENTION

1. Field of the Invention

The present invention relates to high density memory devices based on phase change based memory materials, including chalcogenide based materials and on other programmable resistive materials, and methods for manufacturing such devices.

2. Description of Related Art

Phase change based memory materials, like chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the molten phase change material and allowing at least a portion of the phase change material to stabilize in the amorphous state.

Because the phase change occurs as a result of heating, a relatively large current is needed in order to heat the phase change material and induce the desired phase change. Issues have arisen in obtaining the necessary current for phase change memory cells having field effect transistor access devices due to the relatively low current drive of field effect transistors.

Bipolar junction transistors can provide larger current drive than field effect transistors, but the integration of bipolar junction transistors with CMOS peripheral circuitry is difficult and may result in highly complex designs and manufacturing processes.

The magnitude of the current can be reduced by reducing the size of the phase change memory element in the cell, so that higher current densities are achieved with small absolute current values through the phase change memory element. However, problems have arisen in manufacturing devices with very small dimensions and with variations in manufacturing processes needed to meet the tight tolerance requirements necessary for large scale high-density memory devices.

It is therefore desirable to provide phase change memory cells with bipolar junction transistor access devices addressing the complexity of design integration with CMOS peripheral circuitry, and compatible with manufacturing of peripheral circuitry on the same integrated circuit. Furthermore, it is desirable to provide methods for manufacturing phase change memory cells addressing the tight tolerance requirements needed for large-scale high-density memory devices.

SUMMARY OF THE INVENTION

Memory cells having memory elements self-aligned with the emitters of bipolar junction transistor access devices are described herein. A memory device as described herein comprises a plurality of memory cells. Memory cells in the plurality of memory cells include a bipolar junction transistor comprising an emitter comprising a pillar of doped polysilicon. An insulating element is over the emitter and has an opening extending through the insulating element, the opening centered over the emitter. A memory element is within the opening and is electrically coupled to the emitter.

In embodiments the emitter can be formed during the formation of a sacrificial element used to define the location of the subsequently formed memory element. The sacrificial element is removed to define a via overlying the emitter and an insulating element is formed in the via. The memory element is formed within an opening defined by the insulating element. The opening defined by the insulating element can be formed by processes which result in very small variations in the sublithographic width of the memory element across an array of memory cells.

A memory cell described herein results in the active region within the memory element that can be made extremely small, thereby reducing the magnitude of the current needed to induce a phase change. The width of the memory element within the opening defined by the insulating element is less than that of the doped polysilicon pillar and conductive cap acting as the emitter, and preferably less than a minimum feature size for a process, for example a lithographic process, used to form the doped polysilicon pillar, conductive cap, and bit lines. The small width concentrates current density within the memory element, thereby reducing the magnitude of the current needed to induce a phase change in the active region. Additionally, the insulating element may provide some thermal isolation to the active region, which also helps to reduce the amount of current necessary to induce a phase change. Furthermore, the remaining portion of the memory element can provide some thermal isolation from the bit line for the active region.

A method for manufacturing a memory device described herein comprises forming a single-crystalline substrate having a first conductivity type. A plurality of dielectric trenches and a plurality of word lines are formed within the single-crystalline substrate. Adjacent word lines are separated by a dielectric trench in the plurality of dielectric trenches. A structure is formed overlying the single-crystalline substrate, the structure comprising doped polysilicon material, conductive cap material on the doped polysilicon material, and a sacrificial material on the conductive cap material. The structure is patterned to form a plurality of stacks on the word lines. Sidewall spacers are formed on sidewalls of the stacks. The sacrificial material is removed to define vias, and an insulating layer is formed within the vias, the insulating layer defining openings. Memory elements are formed within the openings, and a plurality of bit lines are formed on the memory elements.

In embodiments described herein logic devices in the periphery region and the memory cells having bipolar junction transistors in the memory region are manufactured concurrently. Gate dielectric material is formed within the memory and periphery regions. The gate dielectric material is removed from the memory region, and a layer of doped polysilicon material and a layer of conductive cap material are formed within the memory and periphery regions. The gates of the logic devices and the emitters of the bipolar junction transistor access devices are both formed using the material of the layers of doped polysilicon material and the conductive cap material. As a result, memory devices described herein include phase change memory cells with bipolar junction transistor access devices compatible with CMOS peripheral circuitry while also addressing the complexity of design integration and manufacturing processes.

Other aspects and advantages of the present invention can be seen on review of the drawings, the detailed description, and the claims which follow.

DETAILED DESCRIPTION

Figure 1:
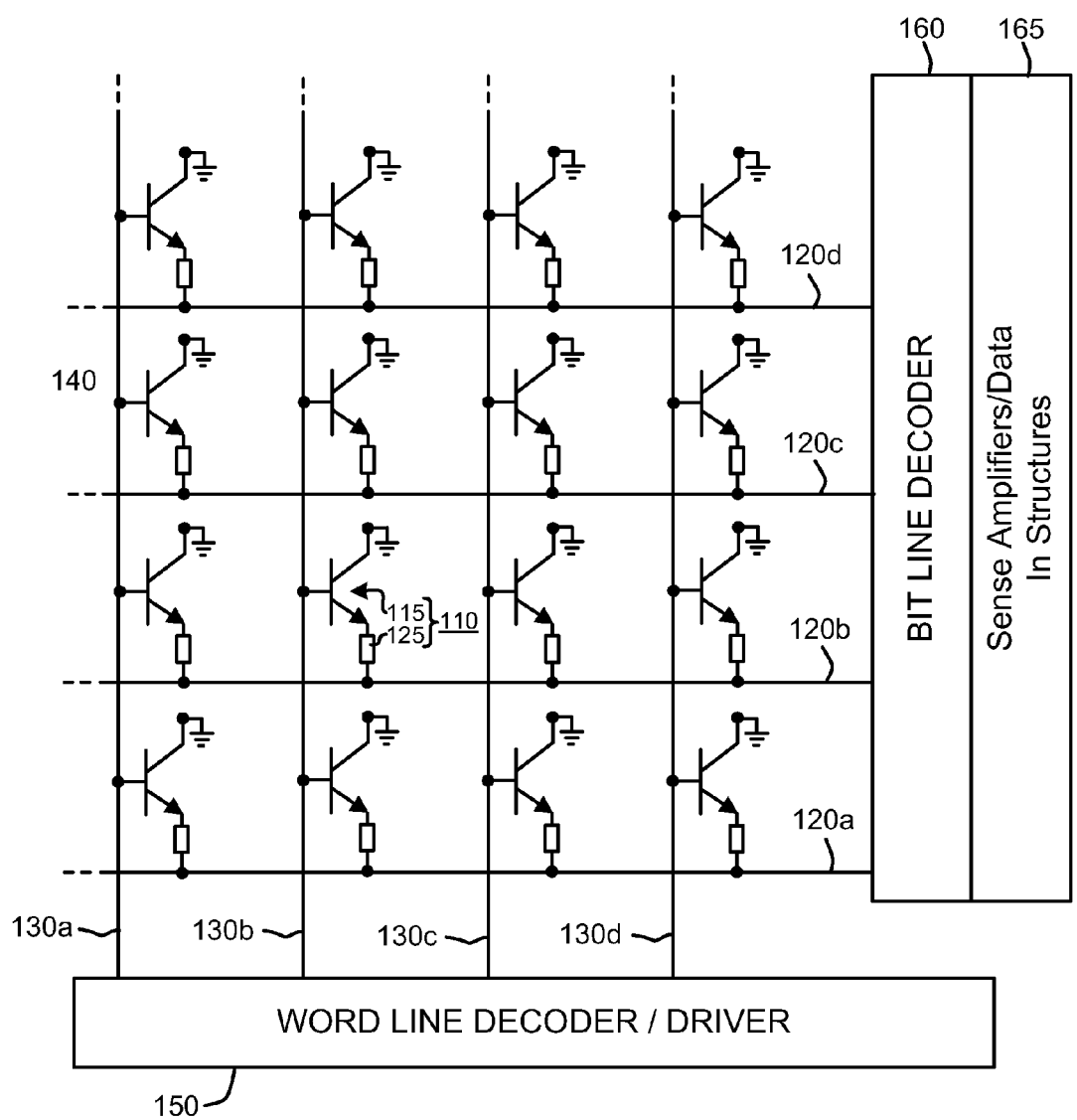
FIG. 1 illustrates a schematic diagram of a portion of a memory cell array implemented using memory cells having bipolar junction transistors with polysilicon emitters and self-aligned memory elements as described herein.

The following description of the disclosure will typically be with reference to specific structural embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

FIG. 1 illustrates a schematic diagram of a portion of a memory cell array 100 implemented using memory cells having bipolar junction transistors with polysilicon emitters and self-aligned memory elements as described herein.

As shown in the schematic diagram of FIG. 1, each of the memory cells of array 100 includes a bipolar junction transistor access device and a memory element arranged in electrical series, the memory elements capable of being set to one of a plurality of resistive states and thus capable of storing one or more bits of data.

The array 100 comprises a plurality of word lines 130 including word lines 130a, 130b, 130c, 130d extending in parallel in a first direction and in electrical communication with word line decoder/driver 150. The word lines 130 are coupled to the base terminals of the bipolar access transistors of the array 100.

A plurality of bit lines 120 including bit lines 120a, 120b, 120c, 120d extend in parallel in a second direction and are in electrical communication with bit line decoder 160. The emitter terminals of the respective bipolar junction transistors are coupled to a corresponding bit line 120 via the memory elements.

The memory cells of the array 100 are coupled in a common collector configuration. In a common collector configuration, the collector terminals of the memory cells are coupled to a constant reference voltage, and the input and output are the base and emitter terminals respectively. Thus, in operation voltages on the bit lines 120 and word lines 130 induce a current to from the bit lines 120 to the collector terminals, or vice versa, through the emitter terminals and the memory elements.

In FIG. 1 the collector terminals are coupled to ground. Alternatively the collector terminals may be coupled to a voltage source for applying a reference voltage other than ground. See, for example, Biasing Arrangement Supply Voltages, Current Sources 2236 of FIG. 22.

Memory cell 110 is representative of the memory cells of array 100 and comprises bipolar junction transistor 115 and phase change memory element 125 arranged in electrical series. The base terminal of the bipolar junction transistor 115 is coupled to the word line 130b, and the emitter terminal of the transistor 115 is coupled to the bit line 120b via the phase change memory element 125.

Reading or writing to memory cell 110 of array 100 can be achieved by applying appropriate voltages and/or currents to the corresponding word line 130b and the corresponding bit line 120b to induce a current through the selected memory cell 110. The level and duration of the voltages/currents applied is dependent upon the operation performed, e.g. a reading operation or a writing operation.

In a reset (erase) operation of the memory cell 110, a reset pulse applied to the word line 130b, and the bit line 120b induces a current through the memory element 125 to cause a transition of an active region of the memory element 125 into an amorphous phase, thereby setting the phase change material to a resistance within a resistive value range associated with the reset state. The reset pulse is a relatively high energy pulse, sufficient to raise the temperature of at least the active region of the memory element 125 above the transition (crystallization) temperature of the phase change material and also above the melting temperature to place at least the active region in a liquid state. The reset pulse is then quickly terminated, resulting in a relatively quick quenching time as the active region quickly cools to below the transition temperature so that the active region stabilizes to a generally amorphous phase.

In a set (or program) operation of memory cell 110, a program pulse is applied to the word line 130b and the bit line 120b of suitable amplitude and duration to induce a current through the memory cell 110 sufficient to raise the temperature of at least a portion of the active region above the transition temperature and cause a transition of at least a portion of the active region from the amorphous phase into a crystalline phase, this transition lowering the resistance of the memory element 125 and setting the memory cell 110 to the desired state.

In a read (or sense) operation of the data value stored in the memory cell 110, a read pulse applied to the corresponding word line 130b and the corresponding bit line 120b of suitable amplitude and duration to induce current to flow that does not result in the memory element 125 undergoing a change in resistive state. The current through the memory cell 110 is dependent upon the resistance of the memory element 125 and thus the data value stored in the memory cell 110. Thus, the data state of the memory cell may be determined, for example, by comparison of the current on bit line 120b with a suitable reference current by sense amplifiers of block 165.

Figure 2A:
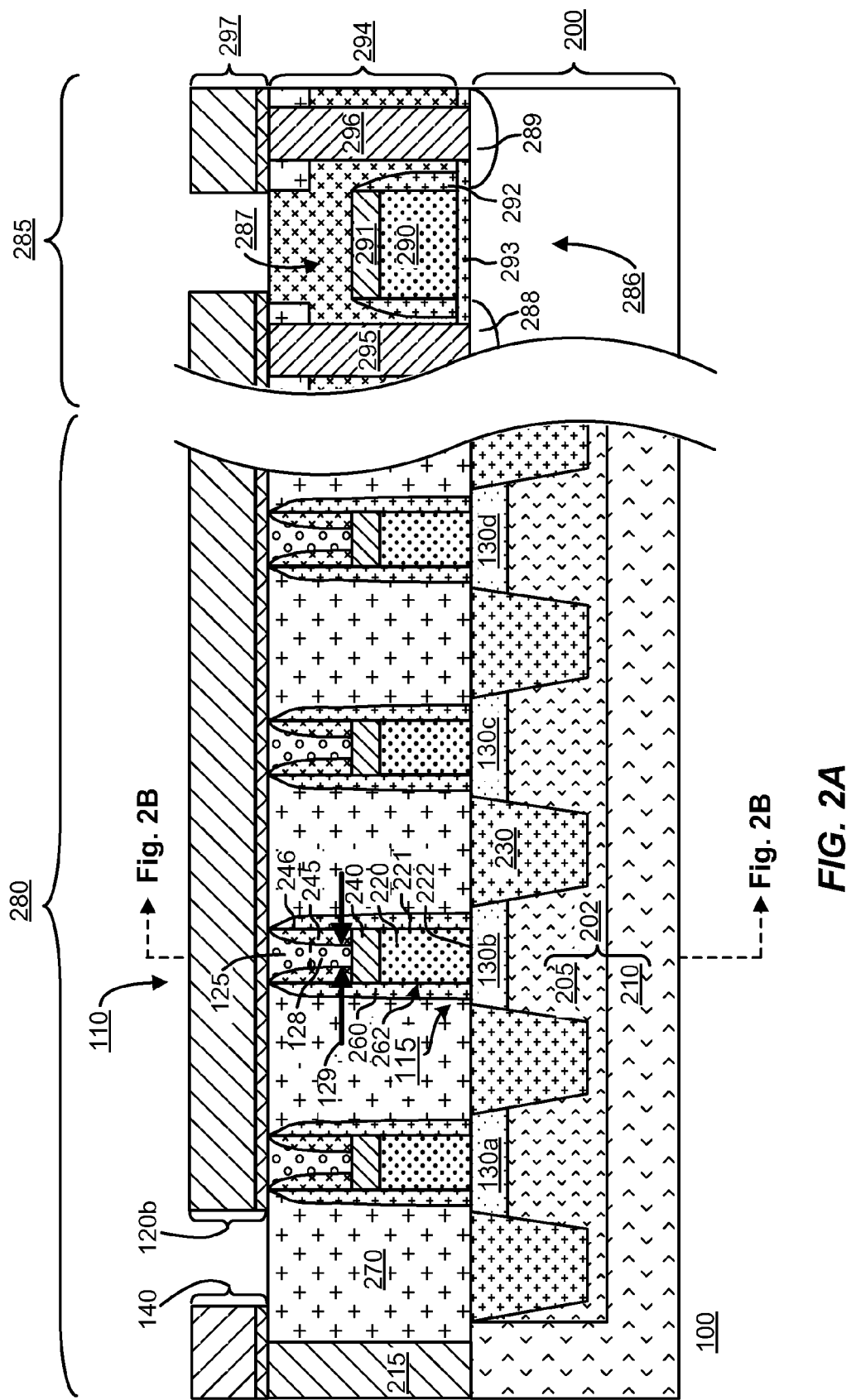
FIGS. 2A and 2B illustrate cross-sectional views of a portion of memory cells arranged in the array, FIG. 2A taken along the bit lines and FIG. 2B taken along the word lines.
Figure 2B:
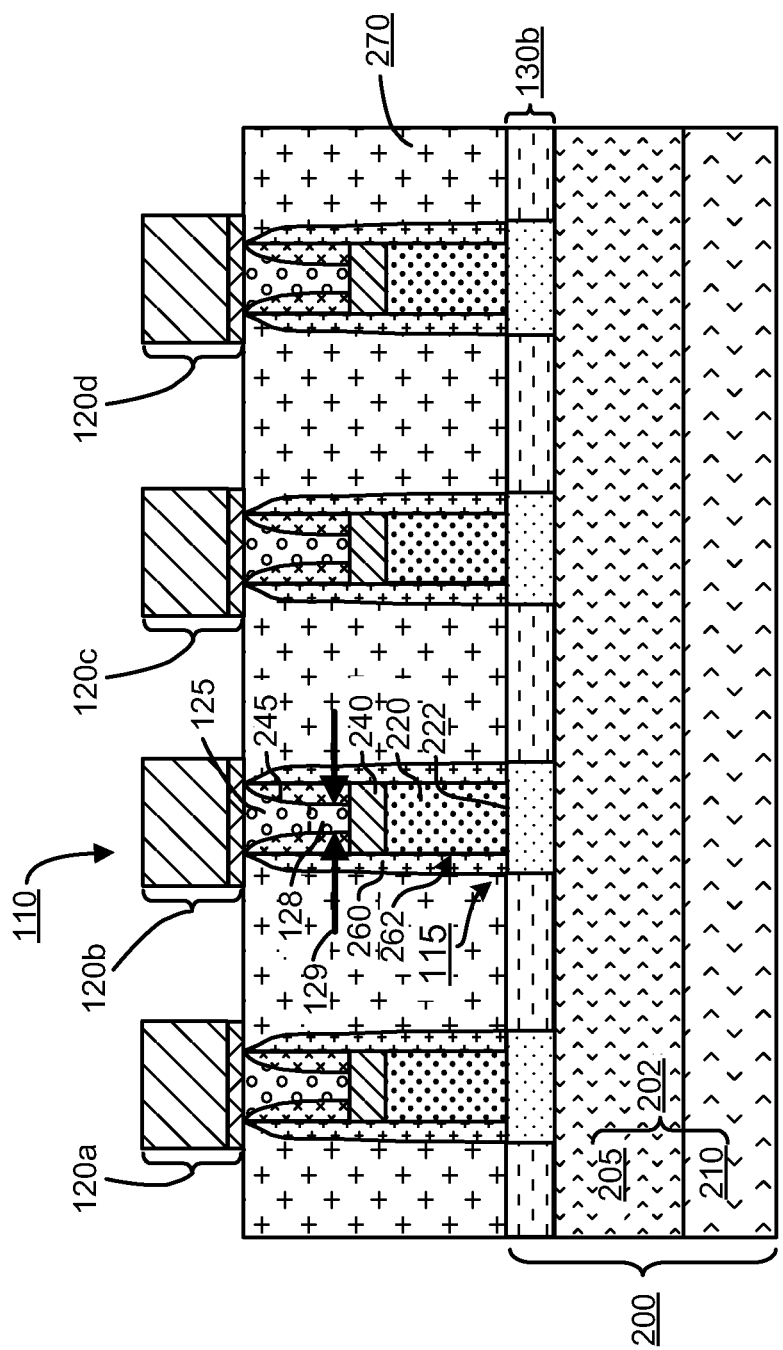

FIGS. 2A and 2B illustrate cross-sectional views of a portion of memory cells (including representative memory cell 110) arranged in the array 100, FIG. 2A taken along the bit lines 120 and FIG. 2B taken along the word lines 130.

The array 100 includes a memory region 280 and a periphery region 285 on a single-crystalline semiconductor substrate 200. The periphery region 285 includes logic device 286 having a gate structure 287 on a gate dielectric layer 293 and overlying the substrate 200, and doped regions 288, 289 acting as the source and drain regions. The gate structure 287 comprises a conductive cap 291 on a doped polysilicon portion 290, and a dielectric spacer 292 on the sidewall of the conductive cap 291 and doped polysilicon portion 290. The conductive cap 291 comprises a silicide containing, for example, Ti, W, Co, Ni, or Ta. A conductive plug 295 is coupled to doped region 288 and extends to the top surface of dielectric 294 to contact bit line 120b, the dielectric 294 comprising one or more layers of dielectric material. A conductive plug 296 is coupled to doped region 289 and extends to the top surface of dielectric 294 to contact line 297.

The memory region 280 includes a well 202 having a first conductivity type within substrate 200, the well 202 comprising a first doped region 205 and a second doped region 210 more highly doped than the first doped region 205. The substrate 200 also includes word lines 130 within the well 202 and extending in a first direction into and out of the cross-section illustrated in FIG. 2A, the word lines 130 separated by dielectric trenches (trench isolation structures) 230 comprising dielectric material within the well. The word lines 130 have a second conductivity type opposite the first conductivity type.

The memory cell 110 includes a doped polysilicon pillar 220 having the first conductivity type, the doped polysilicon pillar 220 contacting the corresponding word line 130b. The doped polysilicon pillar 220 is more highly doped than the portion of the word line 130b underlying the doped polysilicon pillar 220. Thus the pillar 220 and the word line 130b define a pn junction near the interface 222 that is largely inside the word line 130b.

The memory cell 110 includes a conductive cap 240 on the doped polysilicon pillar 220. In the illustrated embodiment the conductive cap 240 comprises a silicide containing, for example, Ti, W, Co, Ni, or Ta. The conductive cap 240 provides a low resistance contact between the doped polysilicon pillar 220 and memory element 125, assists in maintaining the uniformity of current in the doped polysilicon pillar 220 during operation by providing a contact surface that is more highly conductive than the polysilicon material of pillar 220, and can be used as a protective etch stop layer for the doped polysilicon pillar 220 during selective etching of material overlying the pillar 220. In some embodiments the conductive cap 240 may be omitted.

The doped polysilicon pillar 220 and conductive cap 240 extend through dielectric 270. In the illustrated embodiment the dielectric 270 comprises boro-phospho-silicate glass (BPSG) or PSG.

As can be seen in FIG. 2B, the word lines 130 include regions between the doped polysilicon pillars 220 more highly doped than the regions which underlie the spacers 260 and doped polysilicon pillars 220, the more highly doped regions helping to improve the electrical conductivity of the word lines 130 and thus reducing the loading of the word lines 130 and improving the uniformity of the array. Additionally, the more lightly doped regions of the word lines 130 underlying the doped polysilicon pillars 220 improve the breakdown voltage of the pn junction therebetween.

The doped polysilicon pillar 220 and conductive cap 240 act as the emitter of the bipolar junction transistor 115 of the memory cell 110. A portion of the word line 130b underlying the pillar 220 acts as the base of the bipolar junction transistor 115 of the memory cell 110. A portion of the well underlying the word line 130b acts as a collector of the bipolar junction transistor 115 of the memory cell 110.

Conductive contacts 215 couple the second doped region 210 of the well 202 to the conductive material 140 coupled to a reference voltage.

In the illustrated embodiment the doped polysilicon pillar 220 comprises highly doped N-type (N++) polysilicon, the word lines 130 comprise regions of doped P-type material in substrate 200, the first doped region 205 comprises regions of doped N-type material in substrate 200, and the second doped region 210 comprises regions of highly doped N-type (N+) material in substrate 200, thus forming npn bipolar transistor 115.

In an alternative embodiment the doped polysilicon pillar 220 comprises highly doped P-type (P++) polysilicon, the word lines 130 comprise regions of doped N-type material in substrate 200, the first doped region 205 comprises regions of doped P-type material in substrate 200, and the second doped region 210 comprises regions of highly doped P-type (P+) material in substrate 200, thus forming pnp bipolar transistor 115.

Memory element 125 is within an opening defined by a insulating element 245 and electrically couples the conductive cap 240 to the bit line 120b. As a result, the memory element 125 has a bottom surface with a surface area less than that of the top surface of the emitter. The memory element 125 may comprise, for example, one or more materials from the group of Ge, Sb, Te, Se, In, Ti, Ga, Bi, Sn, Cu, Pd, Pb, Ag, S, Si, O, P, As, N and Au.

The insulating element 245 preferably comprises material resistant to diffusion of the memory material of memory element 160. In some embodiments the material of insulating element 245 is chosen for low thermal conductivity for reasons discussed in more detail below.

The bit lines 120, including bit line 120b acting as a top electrode for the memory cell 110, extend into and out of the cross-section illustrated in FIG. 2B. In the illustrated embodiment the bit lines 120 comprise a first conductive layer contacting the memory elements, and a second conductive layer on the first conductive layer. Alternatively, the bit lines 120 may comprise a single conductive layer.

Advantages of having both layers for the bit lines 120 include choosing the material of the first conductive layer for compatibility with the material of memory element 125, while material of the second conductive layer can be chosen for other advantages such as higher electrical conductivity than the material of the first conductive layer. In the illustrated embodiment the first conductive layer comprises TiN and the second conductive layer comprises Al. TiN may be preferred for the first conductive layer in embodiments in which the memory element 120 comprises GST (discussed below) because it makes good contact with GST, it is a common material used in semiconductor manufacturing, and it provides a good diffusion barrier. Alternatively, the first conductive layer may be TaN, TiAlN or TaAlN.

As further examples, the first and second conductive layer of the bit lines 120 may each comprise one or more elements selected from the group consisting of Ti, W, Mo, Al, Ta, Cu, Pt, Ir, La, Ni, N, O, and Ru and combinations thereof In the illustrated embodiment the conductive material 140 and the line 297 also comprise first and second conductive layers like that of the bit lines 120. Alternatively, the conductive material 140 and line 297 may each comprise one or more layers of material each comprising, for example, one or more elements discussed above with reference to the bit lines 120.

The insulating element 245 has sides 246 vertically aligned with sides 221 of the emitter (doped polysilicon pillar 220 and conductive cap 210) to define sidewall 262, and a sidewall spacer 260 comprising dielectric material is on the sidewall 262 and surrounds the emitter and the insulating element 245.

The sides 221 of the emitter, when projected above the emitter, define a cylinder over the emitter. In the illustrated embodiment of FIGS. 2A-2B the cylinder defined by the sides 221 of the emitter can be observed as the sides 246 of the insulating element 245. In the illustrated embodiment the cylinder defined by the sides 221 of the emitter has a circular cross-section since the emitter has a circular cross-section. Alternatively, the cylinder defined by the sides 221 of the emitter may have a cross-section that is square, elliptical, rectangular, or somewhat irregularly shaped, depending on the cross-sectional shape of the emitter.

In the cross-sectional views illustrated in FIGS. 2A and 2B, the insulating element 245 has an opening centered within the cylinder defined by the sides 221 of the emitter, and the memory element 125 is within the opening and is self-aligned with the emitter (doped polysilicon pillar 220 and the conductive cap 240). In the manufacturing embodiment described in more detail below with reference to FIGS. 4 to 17, the doped polysilicon pillar 220 and conductive cap 240 are formed during the patterning of material which defines the locations of the subsequently formed insulating element 245 and memory element 125. The spacer 260 is then formed and the patterned material is selectively removed to form a via defined by the spacer 260 and overlying the conductive cap 240. The insulating element 245 is then formed within the via and has an opening centered on the conductive cap 240, and the memory element 125 is formed within the opening defined by the insulating element 245.

Also described in more detail below with reference to FIGS. 4 to 17, gate dielectric material is formed within the memory and periphery regions. The gate dielectric material is removed from the memory region, and a layer of doped polysilicon material and a layer of conductive cap material are formed within the memory and periphery regions. The gates of the logic devices and the emitters of the bipolar junction transistor access devices are both formed using the material of the layers of doped polysilicon material and the conductive cap material. As a result, memory devices described herein include phase change memory cells with bipolar junction transistor access devices compatible with CMOS peripheral circuitry while also addressing the complexity of design integration and manufacturing processes.

In operation, voltages on the bit line 120b, and word line 130b can induce a current to flow from the emitter through the memory cell 110 to the collector.

The active region 128 is the region of the memory element 125 in which the memory material is induced to change between at least two solid phases. As can be appreciated, the active region 128 can be made extremely small in the illustrated structure, thereby reducing the magnitude of the current needed to induce a phase change. The width 129 of the memory element 125 within the opening defined by the insulating element 245 is less than that of the doped polysilicon pillar 220 and conductive cap 240, and preferably less than a minimum feature size for a process, for example a lithographic process, used to form the doped polysilicon pillar 220, conductive cap 240, and bit lines 120. The small width 129 concentrates current density within the memory element 125, thereby reducing the magnitude of the current needed to induce a phase change in the active region 128. Additionally, the insulating element 245 may provide some thermal isolation to the active region 128, which also helps to reduce the amount of current necessary to induce a phase change. Furthermore, the remaining portion of the memory element 125 can provide some thermal isolation from the bit line 120b for the active region 128.

As described above, bipolar junction transistors can provide larger current drive than field effect transistors. Additionally, since the emitters of the transistors comprise doped polysilicon material a relatively large current gain can be obtained, which reduces the amount of current needed on the word lines 130 to induce the phase change in the memory elements. The reduced amount of current on the word lines 130 reduces the cross-talk between devices sharing the same word line, thus improving the performance of the array. The reduced current on the word lines 130 will also prevent parasitic BJT behavior in which the emitter of a neighboring memory cell acts as a collector.

Figure 3A:
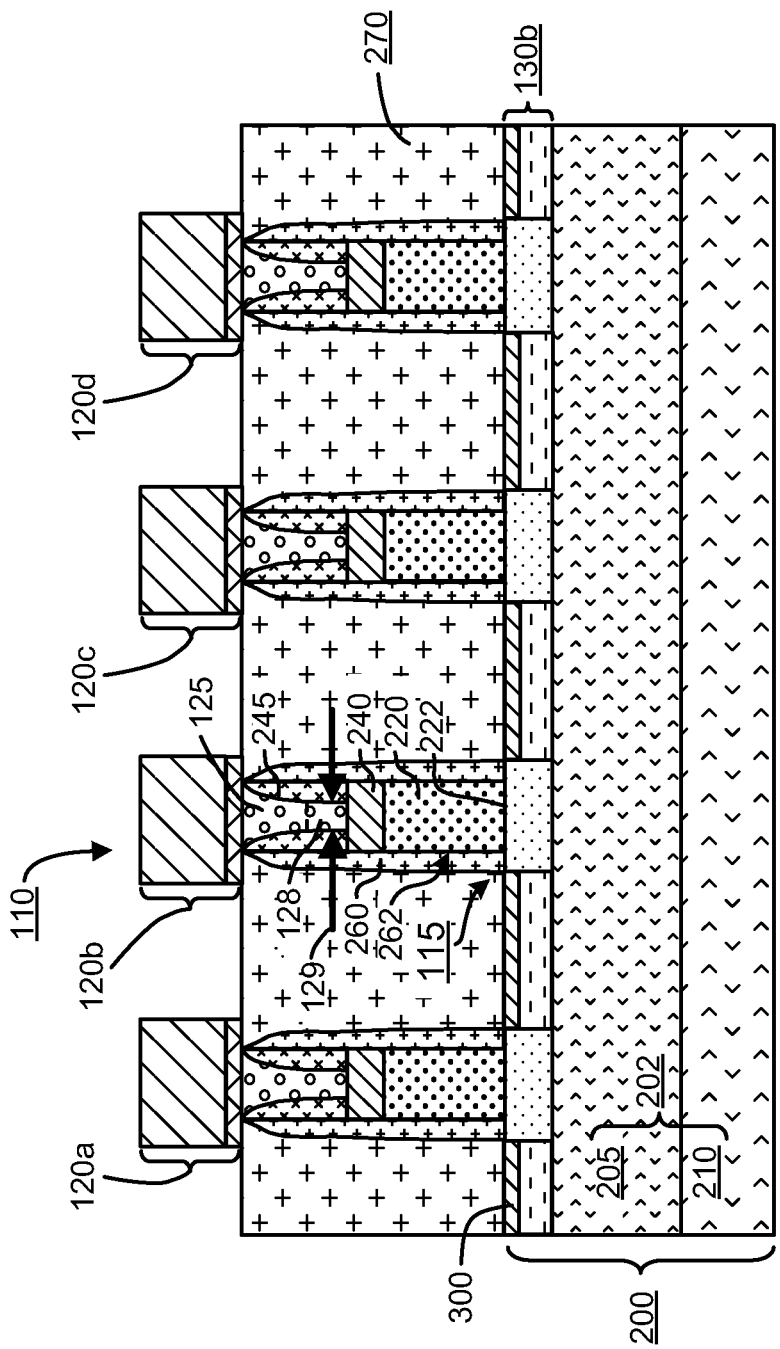
FIG. 3A illustrates a cross-sectional view of a second embodiment similar to the embodiment of FIGS. 2A-2B, with a top conductor comprising silicide on the top surfaces of the more highly doped regions of the word lines.
Figure 21:
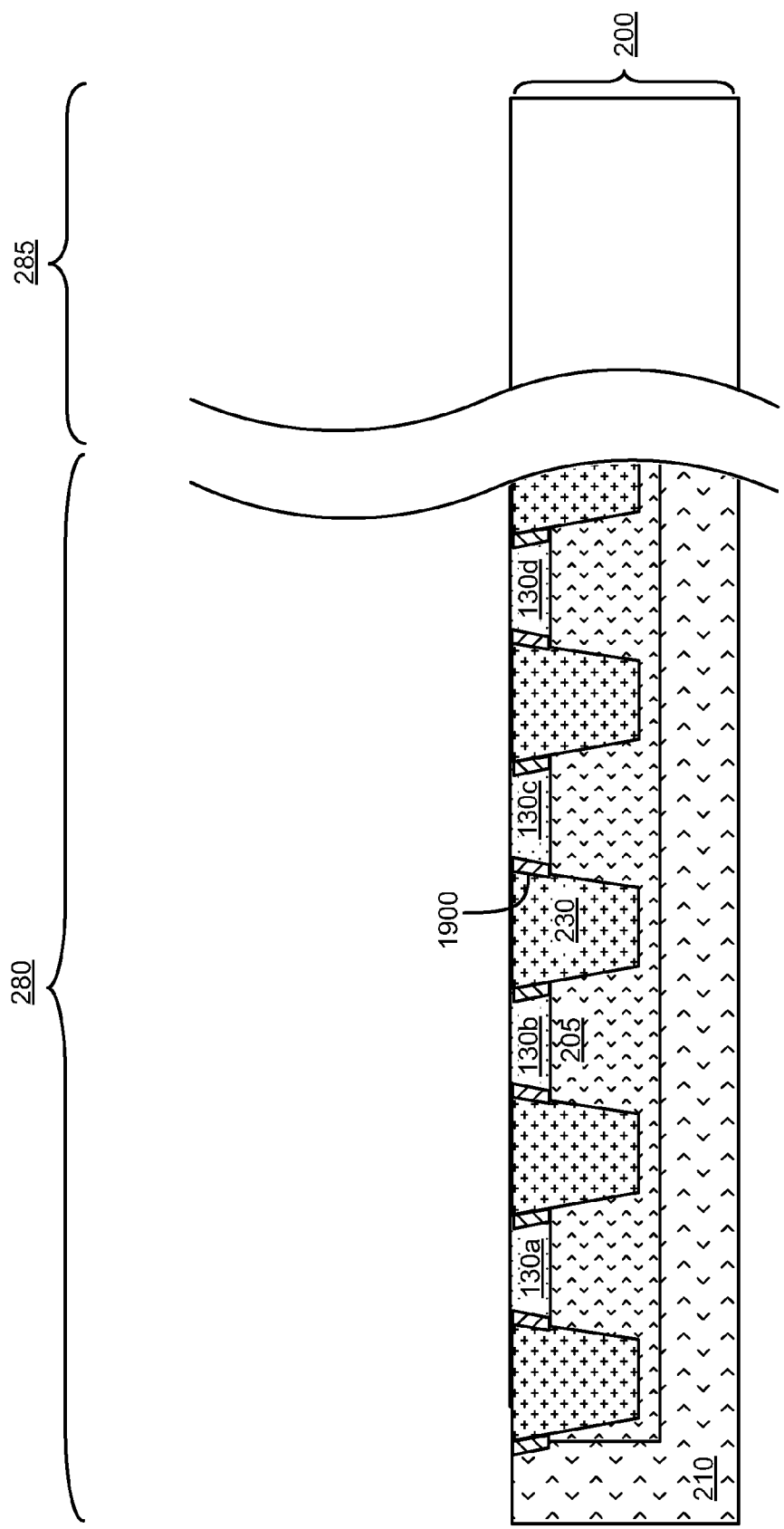

FIG. 3A illustrates a cross-sectional view of a second embodiment similar to the embodiment of FIGS. 2A-2B, with a top conductor 300 comprising silicide on the top surfaces of the more highly doped regions of the word lines 130. The top conductor 300 comprises silicide containing, for example, Ti, W, Co, Ni, or Ta. The top conductor 300 increases the electrical conductivity of the word lines 130 and thus reduces the turn on current and the loading of the word lines 130, resulting in improved uniformity of the array. The top conductor 300 comprising silicide also removes minority carriers from the word lines 130 to prevent parasitic BJT behavior. Also, as shown in FIG. 21, in some embodiments sidewall conductors 1900 comprising silicide are formed on the sidewalls of the word lines 130. The silicide sidewall conductors 1900 remove minority carriers from the word lines and improve conductivity of the word lines 130.

Embodiments of the memory cells described herein include phase change based memory materials, including chalcogenide based materials and other materials, for the memory element. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a-b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112 patent, cols. 10-11.) Particular alloys evaluated by another researcher include Ge2Sb2Te5, GeSb2Te4 and GeSb4Te7 (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including other materials that use different crystal phase changes to determine resistance, or other memory materials that use an electrical pulse to change the resistance state. Examples include materials for use in resistance random access memory (RRAM) such as metal-oxides including tungsten-oxide ($WO_x$), NiO, $Nb_2O_5$, $CuO_2$, $Ta_2O_5$, $Al_2O_3$, CoO, $Fe_2O_3$, $HfO_2$, $TiO_2$, $SrTiO_3$, $(BaSr)TiO_3$. Additional examples include materials for use in magnetoresistance random access memory (MRAM) such as spin-torque-transfer (STT) MRAM, for example at least one of CoFeB, Fe, Co, Ni, Gd, Dy, CoFe, NiFe, MnAs, MnBi, MnSb, $CrO_2$, $MnOFe_2O_3$, $FeOFe_2O_5$, $NiOFe_2O_3$, $MgOFe_2$, EuO, and $Y_3Fe_5O_{12}$. See, for example, US Publication No 2007/0176251 entitled "Magnetic Memory Device and Method of Fabricating the Same", which is incorporated by reference herein. Additional examples include solid electrolyte materials used for programmable-metallization-cell (PMC) memory, or nano-ionic memory, such as silver-doped germanium sulfide electrolytes and copper-doped germanium sulfide electrolytes. See, for example, N. E. Gilbert et al., "A macro model of programmable metallization cell devices," Solid-State Electronics 49 (2005) 1813-1819, which is incorporated by reference herein.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously. An exemplary method for forming chalcogenide material using chemical vapor deposition (CVD) is disclosed in US Publication No 2006/0172067 entitled "Chemical Vapor Deposition of Chalcogenide Materials", which is incorporated by reference herein. Another exemplary method for forming chalcogenide material using CVD is disclosed in Lee, et al., "Highly Scalable Phase Change Memory with CVD GeSbTe for Sub 50 nm Generation, 2007 Symposium on VLSI Technology Digest of Technical Papers, pp. 102-103.

A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes.

FIGS. 4-17 illustrate steps in a fabrication sequence for manufacturing an array of memory cells having bipolar junction transistors with polysilicon emitters and self-aligned memory elements as described herein.

Figure 4:
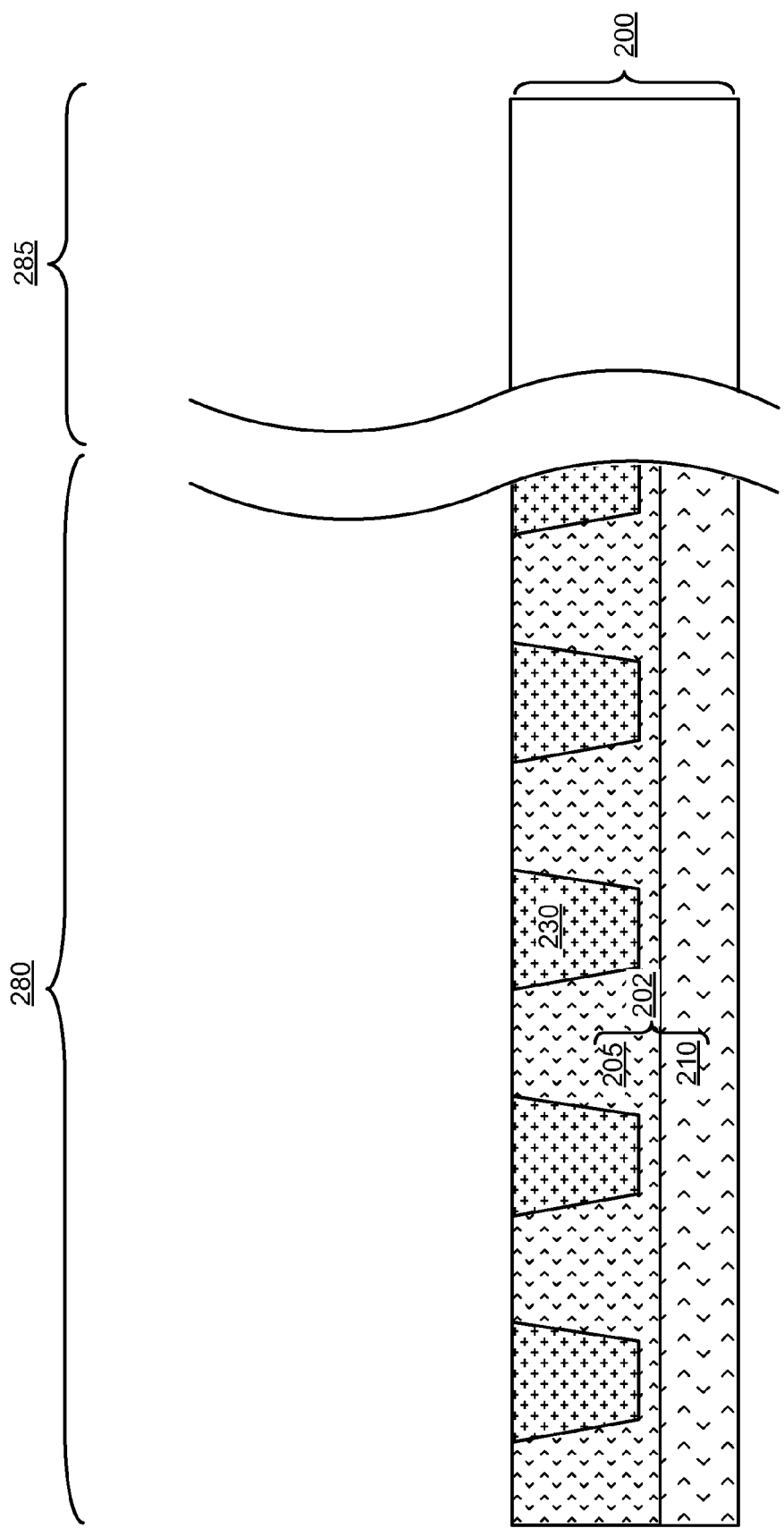
FIGS. 4-17b illustrate steps in a fabrication sequence for manufacturing an array of memory cells having bipolar junction transistors with polysilicon emitters and self-aligned memory elements as described herein.

FIG. 4 illustrates a first step of forming a substrate including a well 202 within the memory region 280 comprising first and second doped regions 205, 210 and dielectric trenches 230 within the well 202 and extending into and out of the cross-section illustrated in FIG. 4. The first and second doped regions 205, 210 can be formed by implantation and activation annealing processes as known in the art. In the illustrated embodiment the first doped region 205 comprises doped N-type material of substrate 200, and the second doped region 210 comprises highly doped N-type (N+) material of substrate 200. In an alternative embodiment the first doped region 205 comprises doped P-type material of substrate 200, and the second doped region 210 comprises highly doped P-type (P+) material of substrate 200.

Figure 5A:
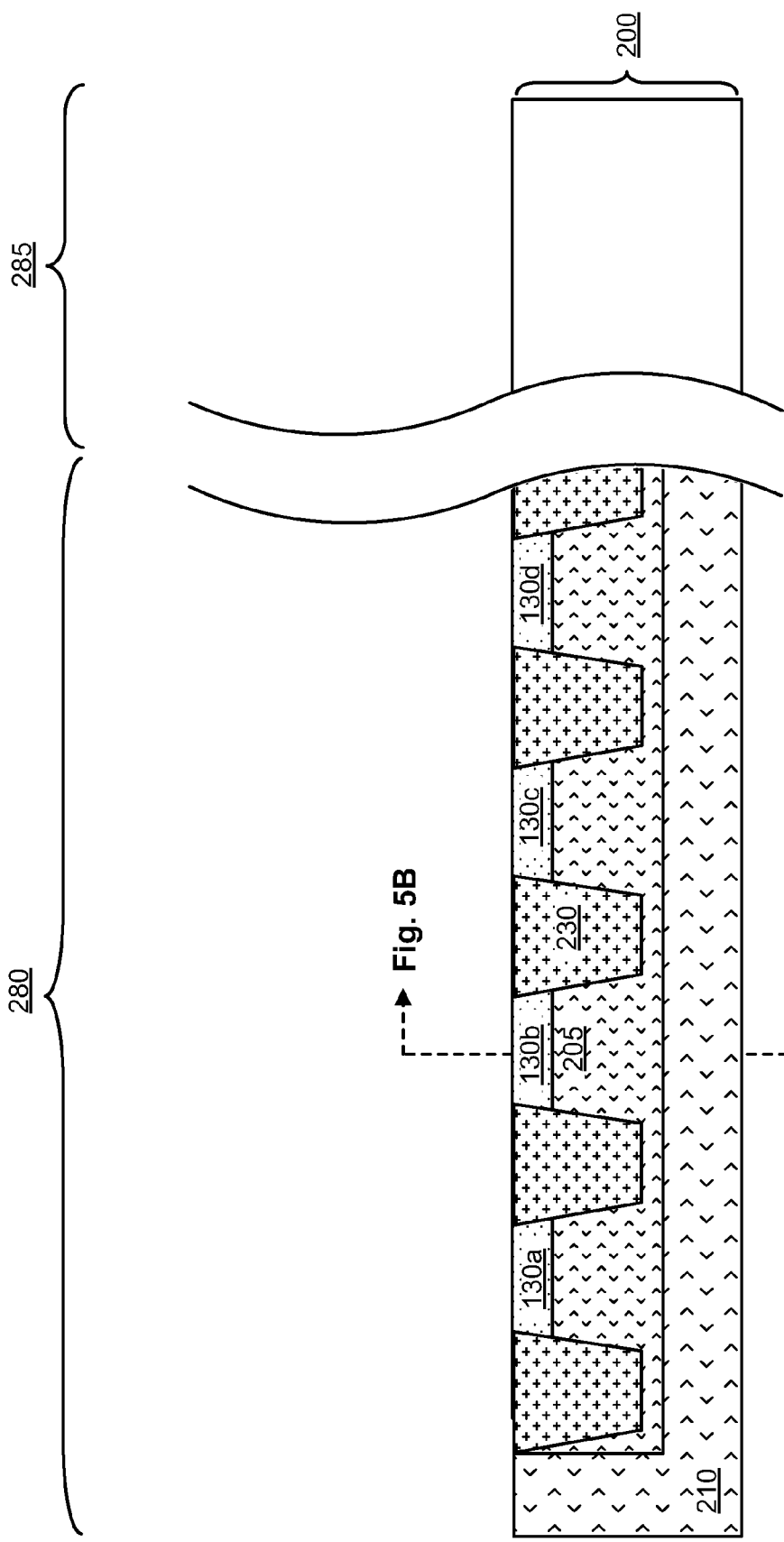
Figure 5B:
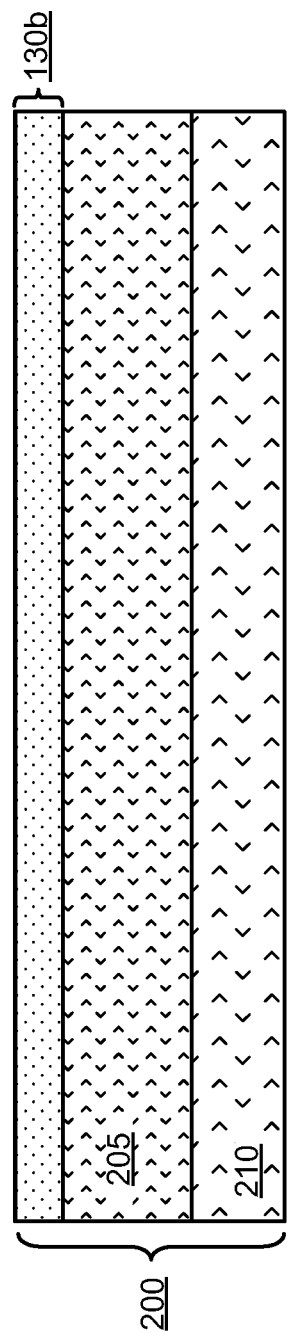

Next, word lines 130 are formed by implantation within the first doped region 205 of the well, resulting in the structure illustrated in the cross-sectional views of FIGS. 5A and 5B. Also, in the illustrated embodiment a second ion implantation step is performed within the well to form a highly doped region extending from the top surface of the substrate 200 to the second doped region 210. The word lines 130 have the second conductivity type, and in the illustrated embodiment the word lines 130 comprise doped P-type material of substrate 200. In an alternative embodiment the word lines 130 comprise doped N-type material of substrate 200.

Figure 6:
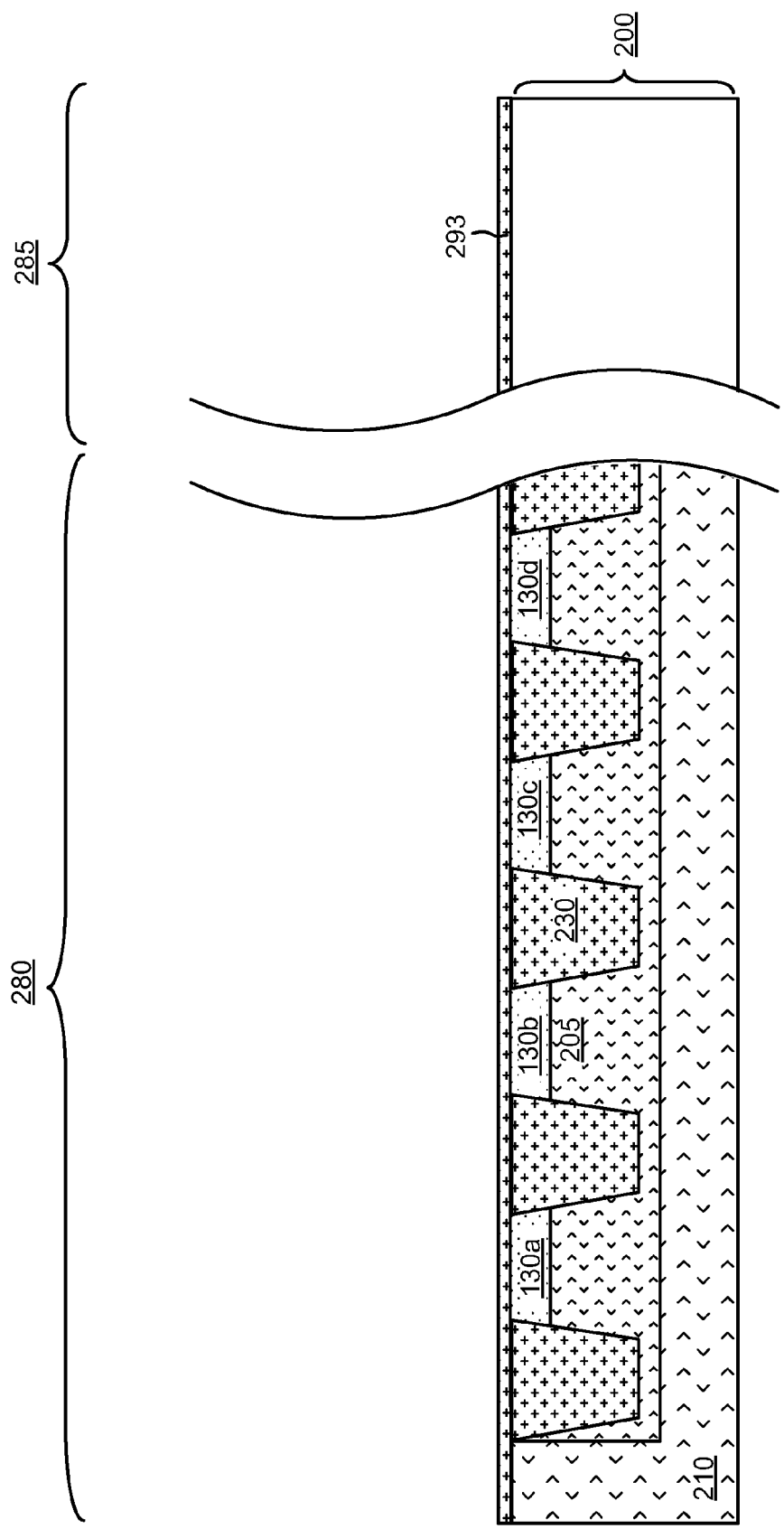

Next, gate dielectric layer 293 is formed on the structure illustrated in FIGS. 5A-5B within the memory region 280 and the periphery region 285, resulting in the structure illustrated in FIG. 6. In the illustrated embodiment the gate dielectric layer 293 comprises silicon dioxide.

Figure 7A:
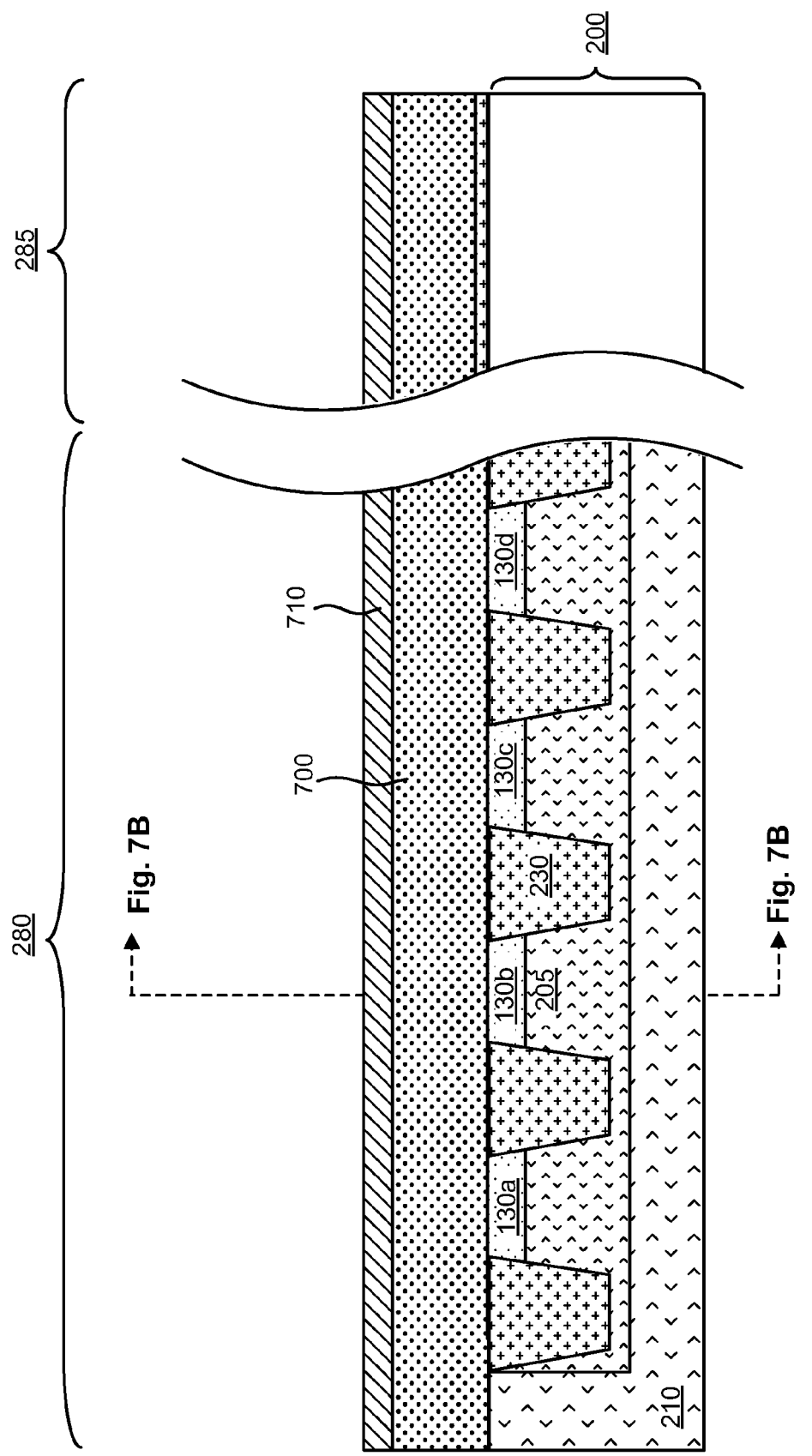
Figure 7B:
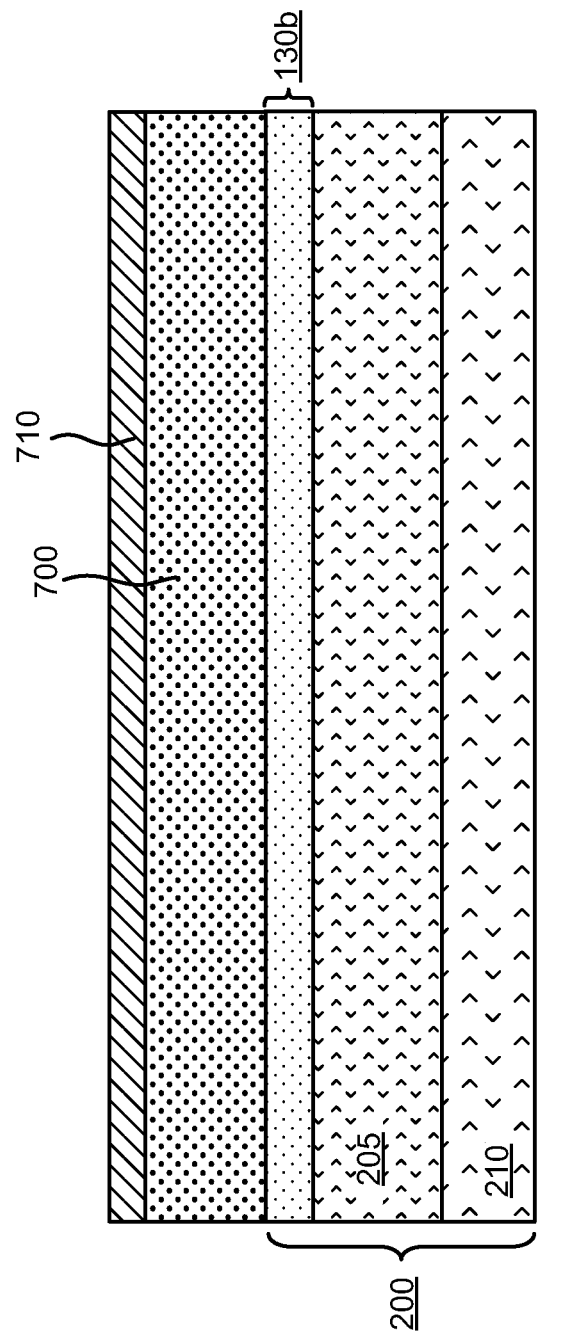

Next, the dielectric layer 293 is removed from the memory region 280 of the structure illustrated in FIGS. 6A-6B, a layer 700 of doped polysilicon material having the first conductivity type is formed, and a layer 710 conductive cap material is formed on the doped polysilicon layer 700, resulting in the structure illustrated in the cross-sectional views of FIGS. 7A and 7B. The conductive cap material of layer 710 comprises a silicide containing, for example, Ti, W, Co, Ni, or Ta. In one embodiment the layer 710 comprises cobalt silicide (CoSi) and is formed by depositing a layer of cobalt and performing a rapid thermal process (RTP) such that the cobalt reacts with the silicon of the layer 700 to form the layer 710. It is understood that other silicides may also be formed in this manner by deposition of titanium, arsenic, doped nickel, or alloys thereof, in a manner similar to the example described herein using cobalt.

Figure 8A:
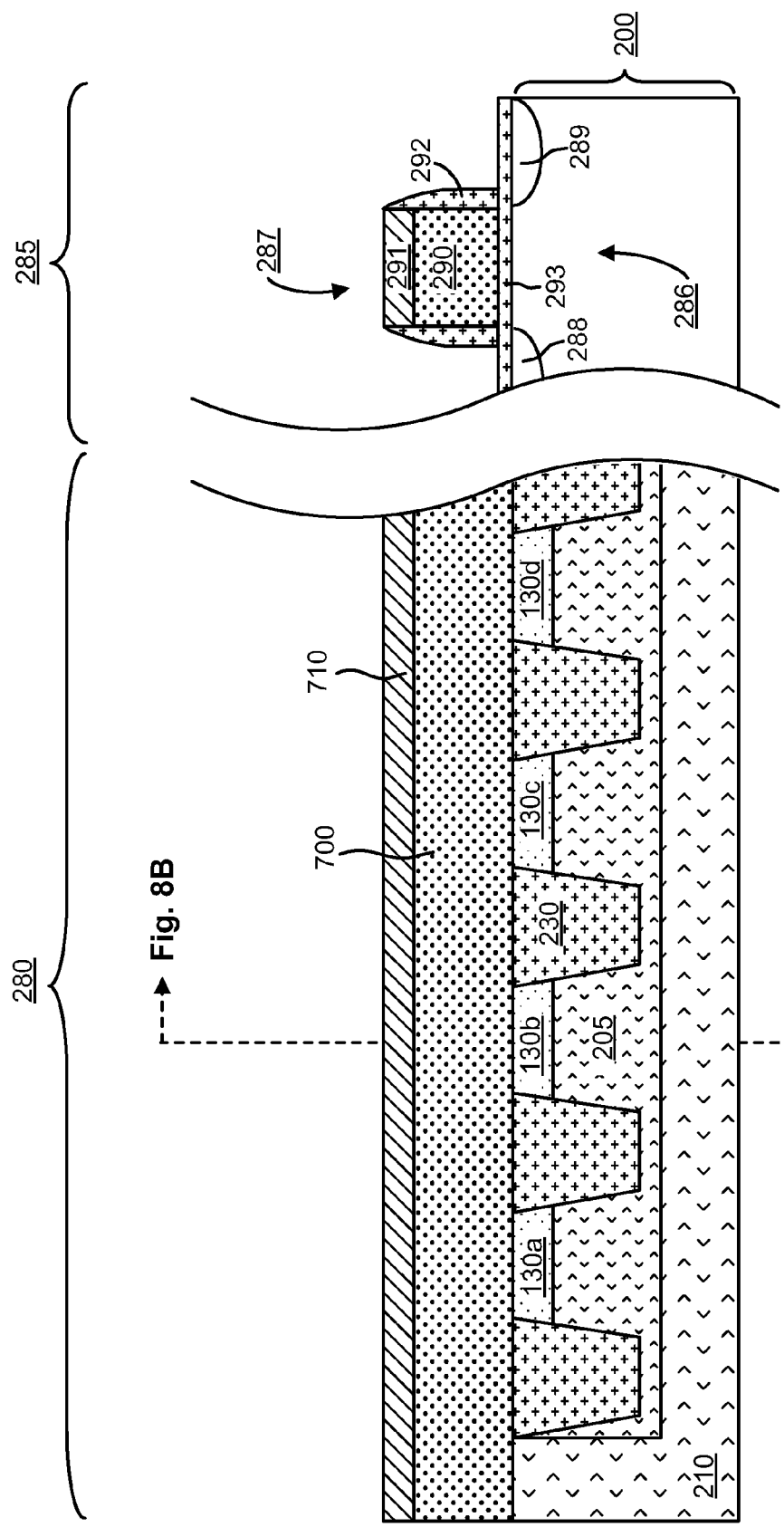
Figure 8B:
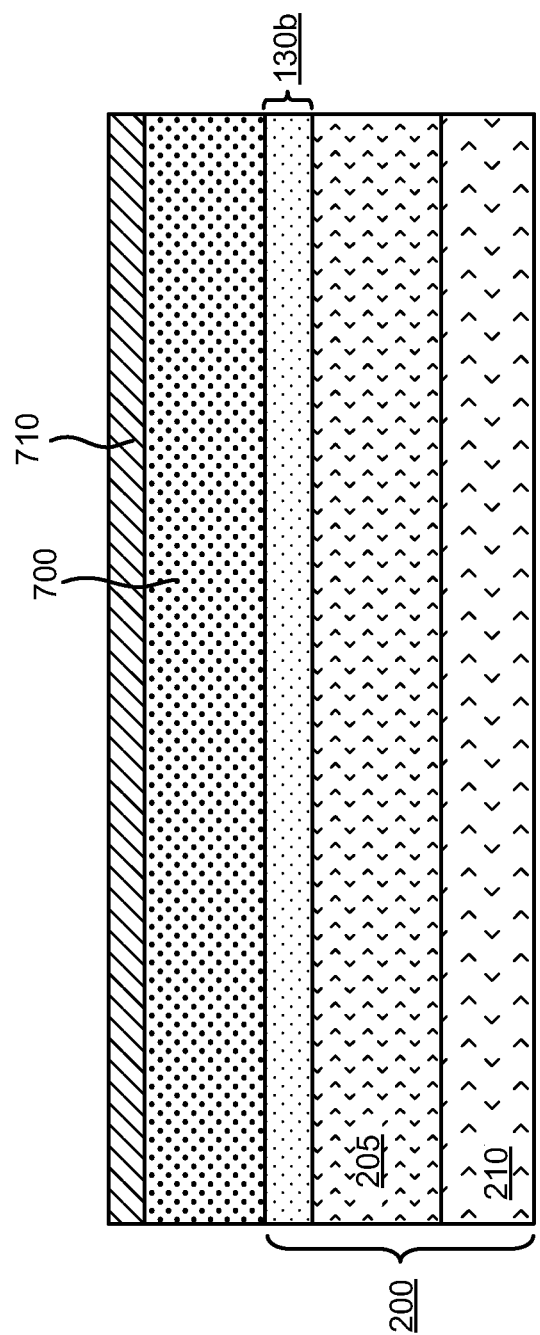

Next, the logic device 286 is formed within the periphery region 285 of the structure illustrated in FIGS. 7A-7B, resulting in the structure illustrated in FIGS. 8A and 8B. In the illustrated embodiment the logic device 286 is formed by patterning the layers 700 and 710 within the periphery region 285 to form the doped polysilicon portion 290 and conductive cap 291 of the gate structure 287, performing a lightly doped drain (LDD) implantation process to form lightly doped regions within the substrate 200 adjacent the gate structure 287, forming the insulating layer 292 on the sidewall of the conductive cap 291 and doped polysilicon portion 290, and performing a second implantation process to form doped regions 288, 289 acting as the source and drain of the logic device 286. Alternatively, other techniques may be used to form the logic device 286.

Figure 9A:
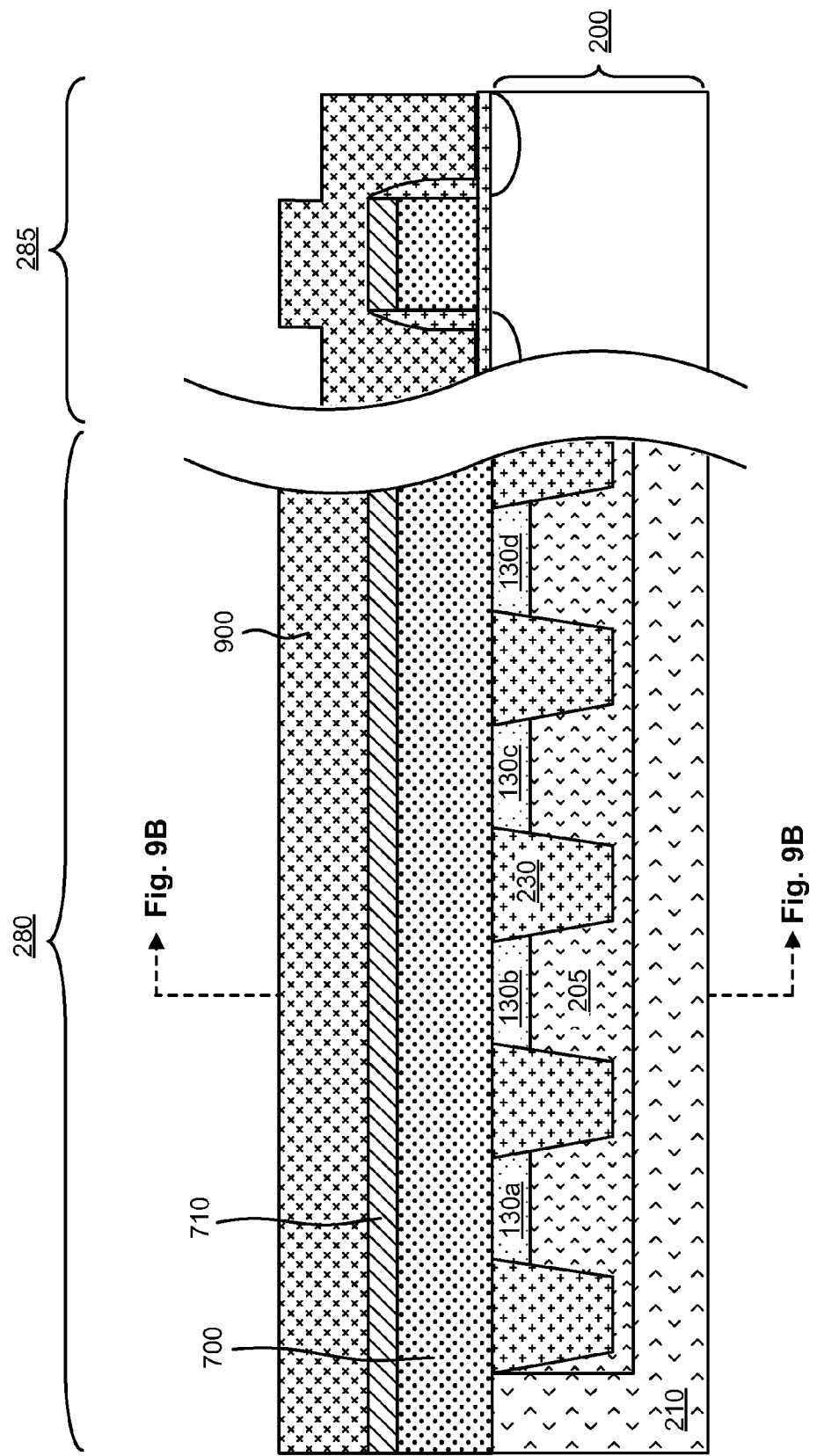
Figure 9B:
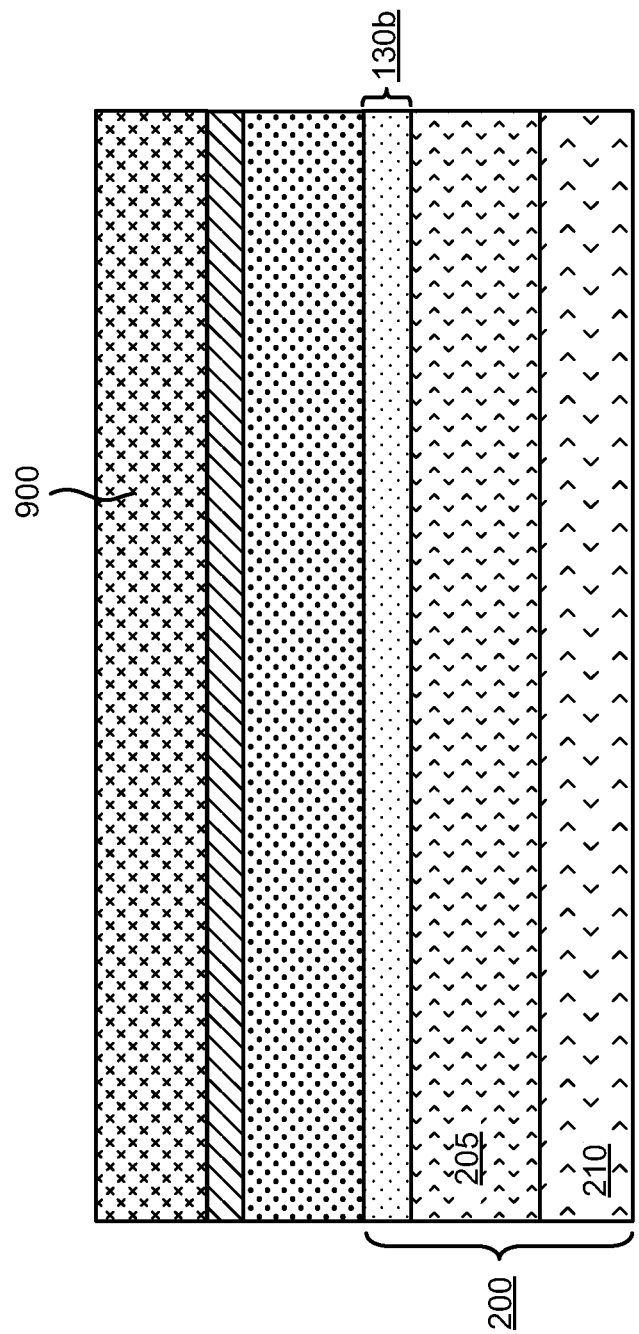

Next, a layer 900 of dielectric material is formed on the structure illustrated in FIGS. 8A-8B, resulting in the structure illustrated in FIGS. 9A and 9B. In the illustrated embodiment the layer 900 comprises silicon nitride.

Figure 10A:
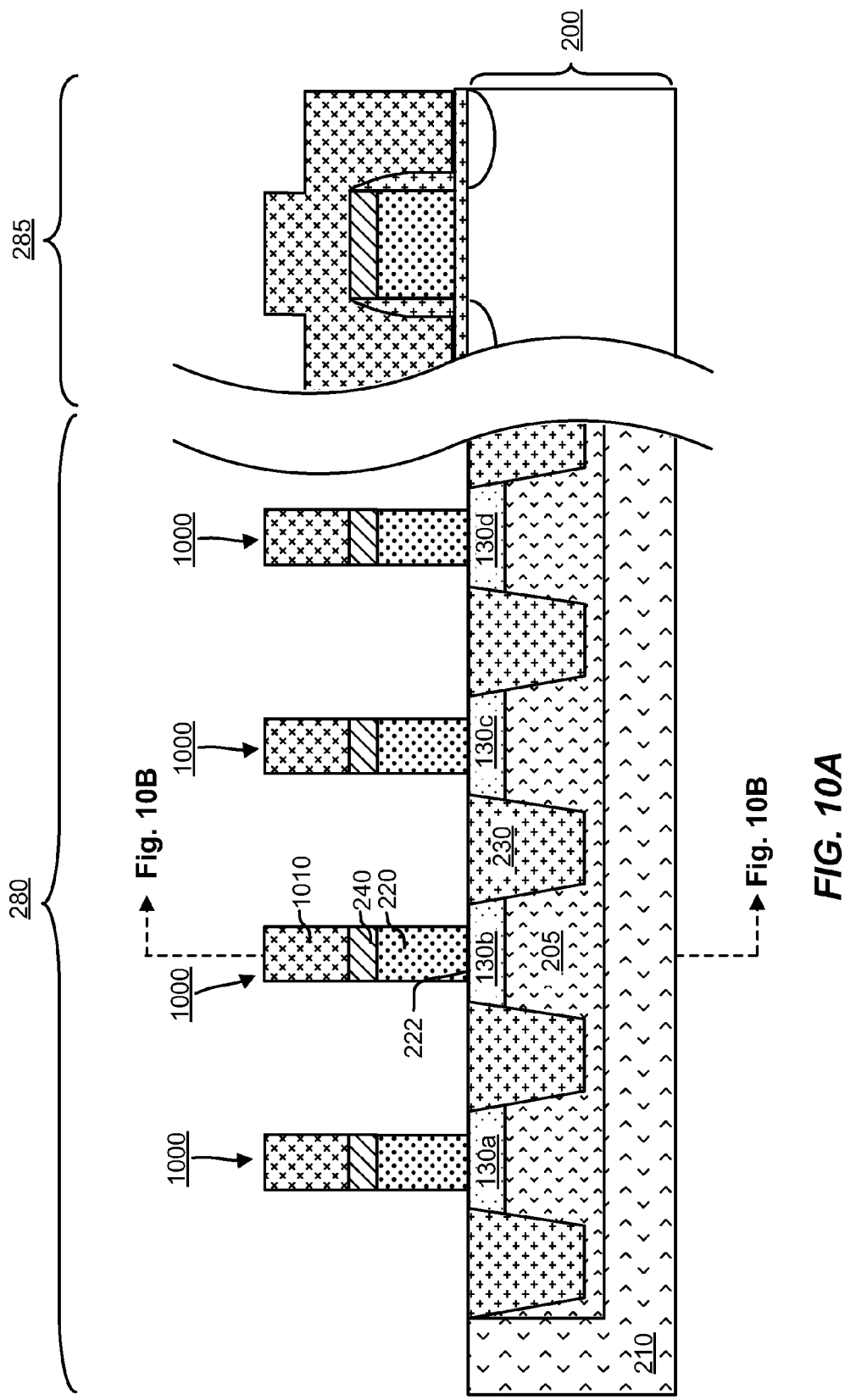
Figure 10B:
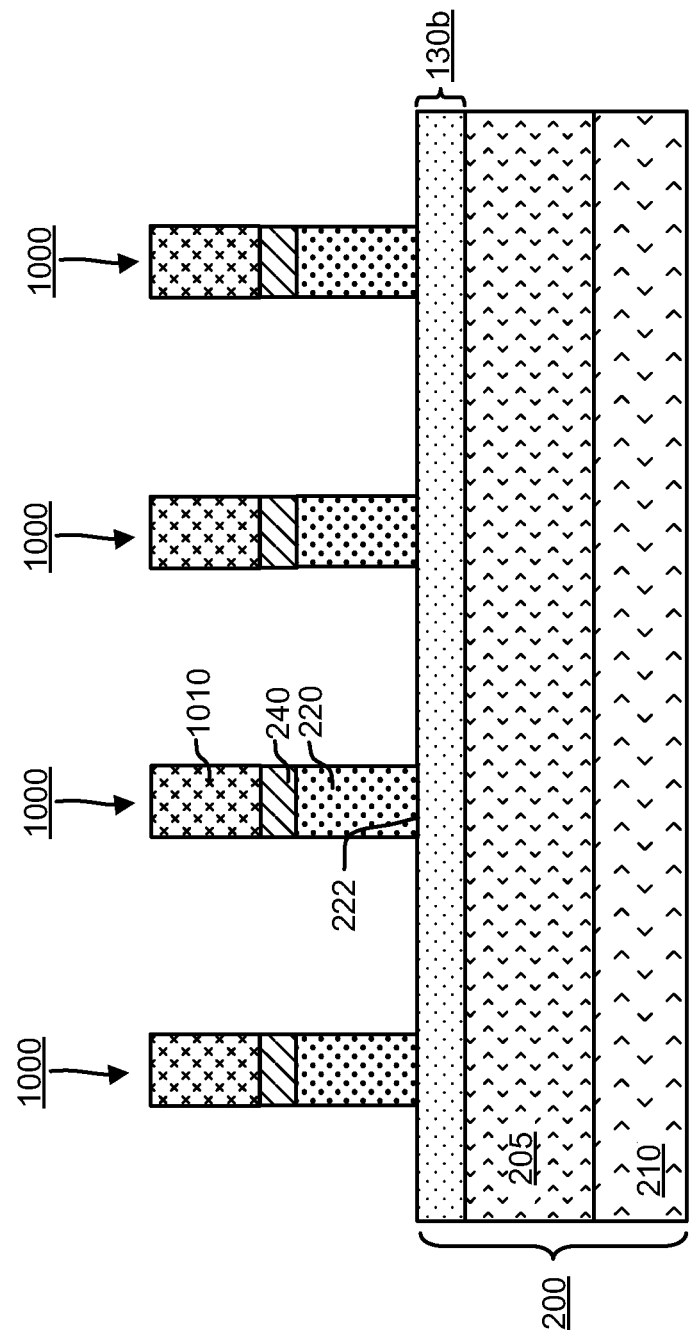

Next, layers 900, 700, and 710 within the memory region 280 of FIGS. 9A-9B are patterned to form a plurality of multi-layer stacks 1000 on the word lines 130, resulting in the structure illustrated in FIGS. 10A and 10B. The multi-layer stacks 1000 can be formed, for example, by forming a mask (for example a layer of patterned photoresist) on layer 900 overlying the locations of the multi-layer stacks 1000, and then etching through layers 900, 700, and 710 using the mask as an etch mask.

As can be seen in FIGS. 10A and 10B, each of the multi-layer stacks 1000 includes a doped polysilicon pillar 220 comprising material from layer 700 (See FIGS. 9A-9B) on the corresponding word line 130 to define a pn junction near the interface 222 therebetween, a conductive cap 240 comprising material from layer 710 (See FIGS. 9A-9B) on the pillar 220, and a sacrificial element 1010 comprising material from layer 900 on the conductive cap 240.

In the illustrated embodiment the multi-layer stacks 1000 have a circular cross-section. Alternatively, in embodiments the multi-layer stacks 1000 may have a cross-section that is square, elliptical, rectangular, or somewhat irregularly shaped, depending on the manufacturing technique used to form the multi-layer stacks 1000.

Figure 11A:
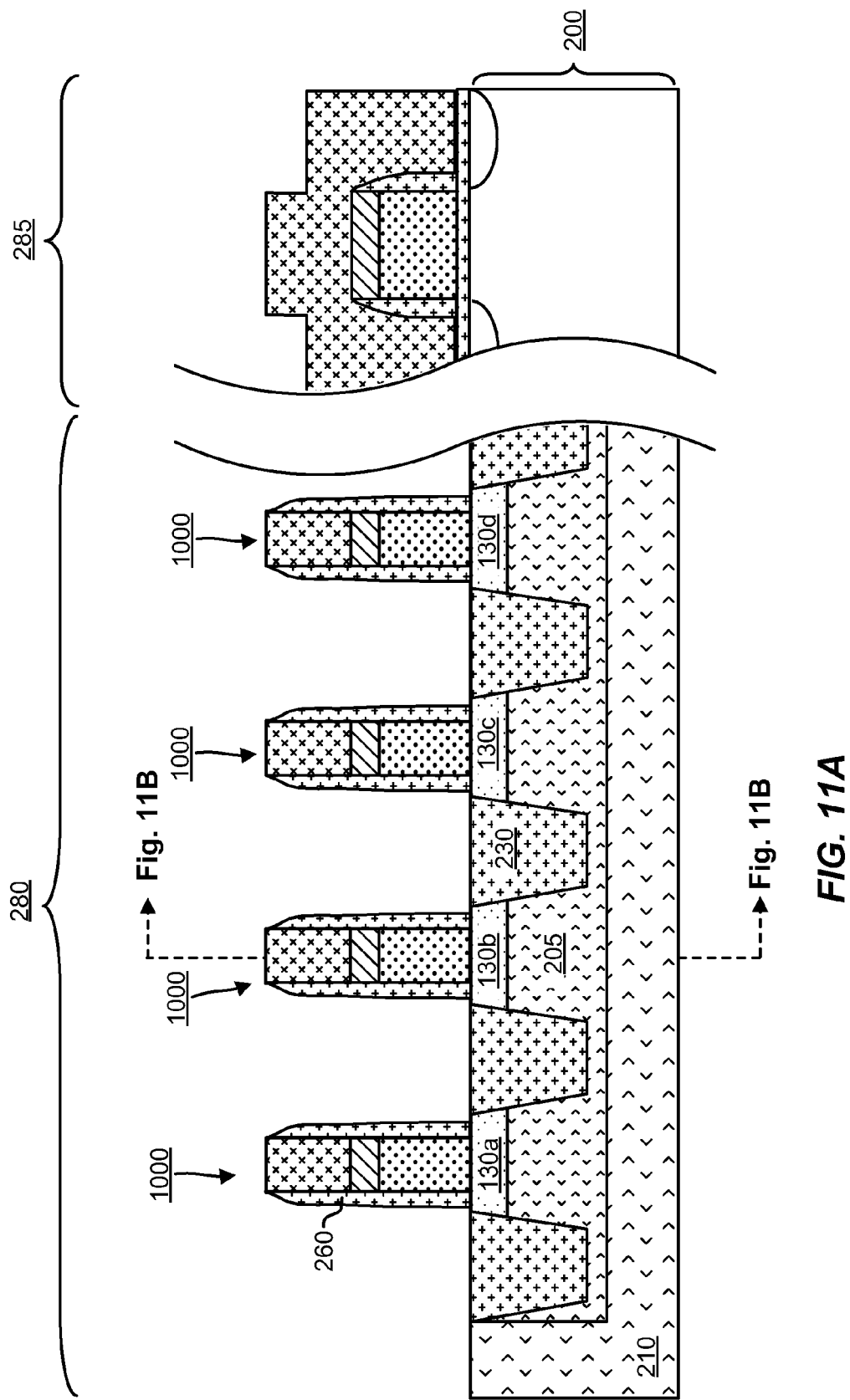
Figure 11B:
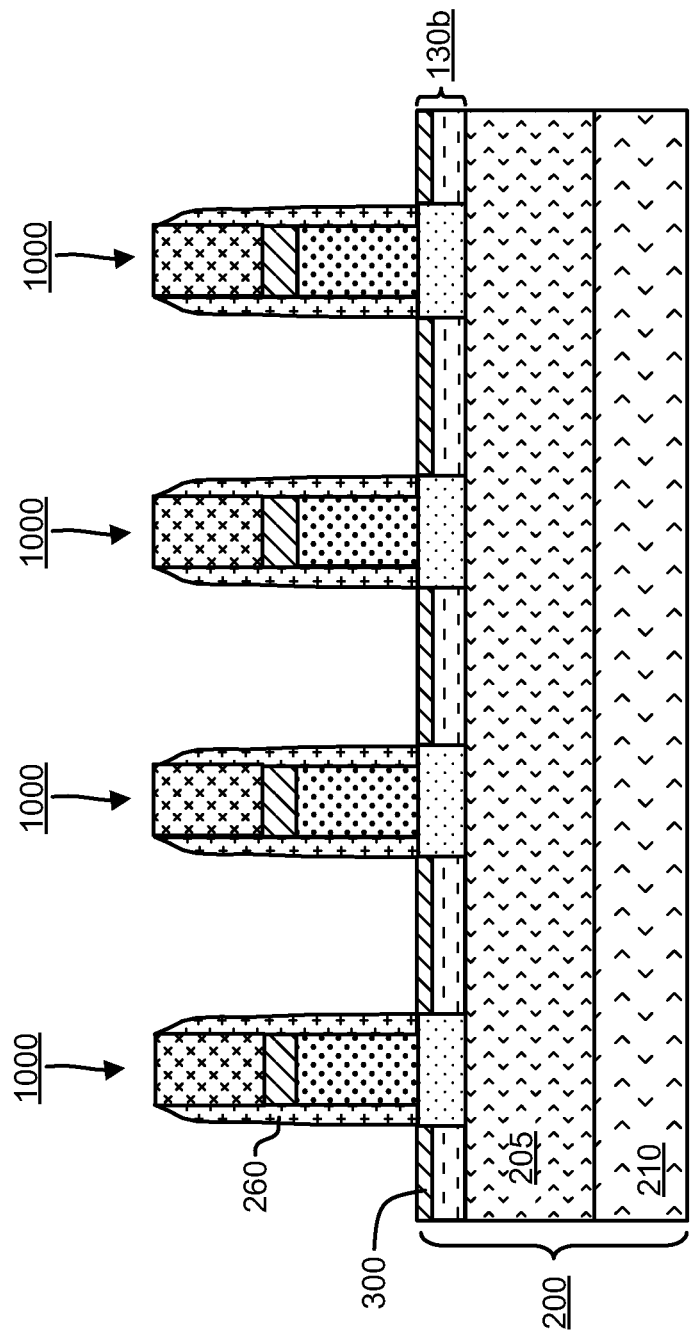

Next, sidewall spacers 260 comprising dielectric material are formed on the sidewalls of the multi-layer stacks 1000, an implantation process is performed to form more highly doped regions of the portions of the word lines 130 between adjacent spacers 260, and top conductors 300 comprising self-aligned silicide (salicide) are formed on the more highly doped regions of the word lines 130, resulting in the structure illustrated in FIGS. 11A and 11B. In some embodiments the top conductors 300 may be omitted.

The sidewall spacers 260 can be formed by depositing a conformal layer of sidewall spacer material on the structure illustrated in FIGS. 10A-10B, and anisotropically etching the conformal layer to form the sidewall spacers 260. The sidewall spacers protect the stacks 1000 and the interface between the stacks 1000 and the word lines 130 during the silicide process that forms the top conductors.

In one embodiment the top conductors 300 comprise cobalt silicide (CoSi) and are formed by depositing a layer of cobalt and performing a rapid thermal process (RTP) such that the cobalt reacts with the silicon of the word lines 130 to form the top conductors. It is understood that other silicides may also be formed in this manner by deposition of titanium, arsenic, doped nickel, or alloys thereof, in a manner similar to the example described herein using cobalt.

Figure 12A:
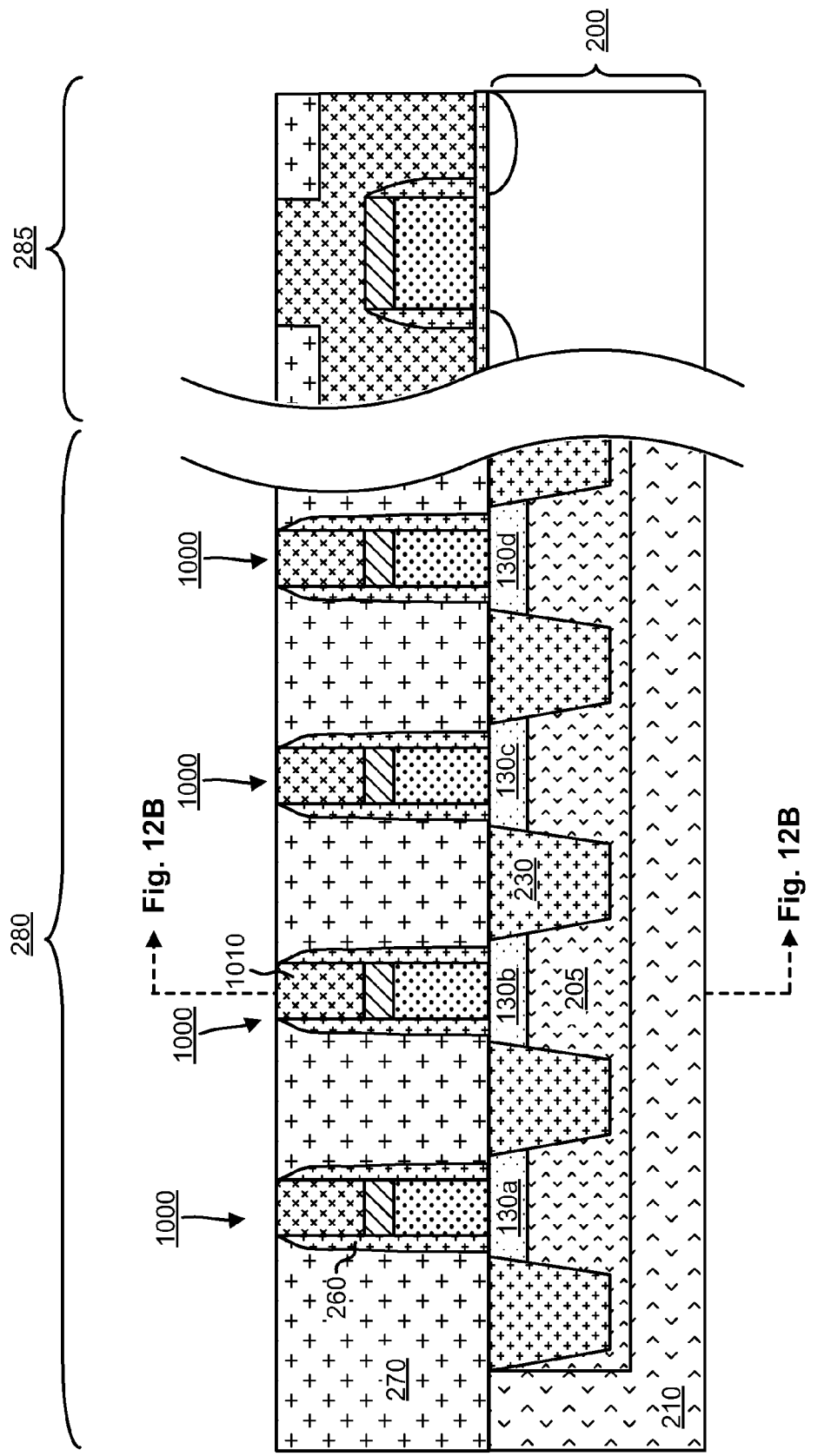
Figure 12B:
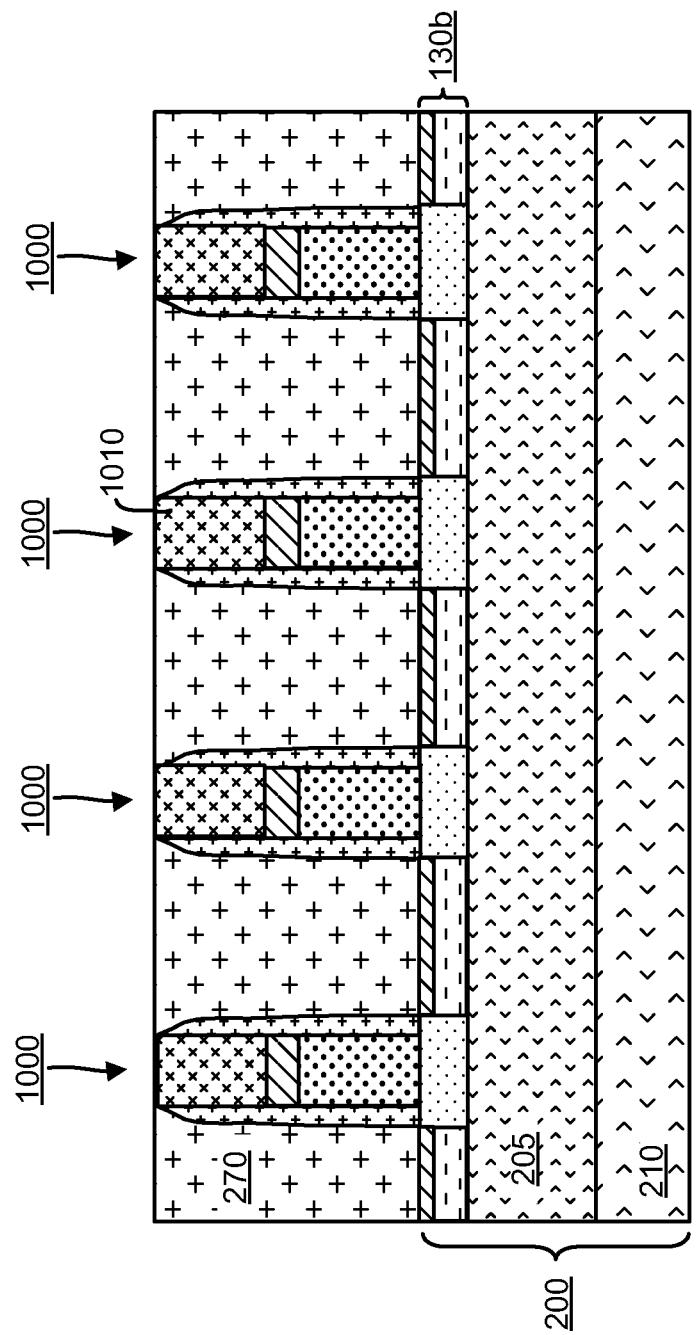

Next, dielectric layer 270 is formed on the structure illustrated in FIGS. 11A-11B and a planarization process such as CMP is performed to expose top surfaces of the sacrificial elements 1010 of the multi-layer stacks 1000, resulting in the structure illustrated in FIGS. 12A and 12B.

Figure 13A:
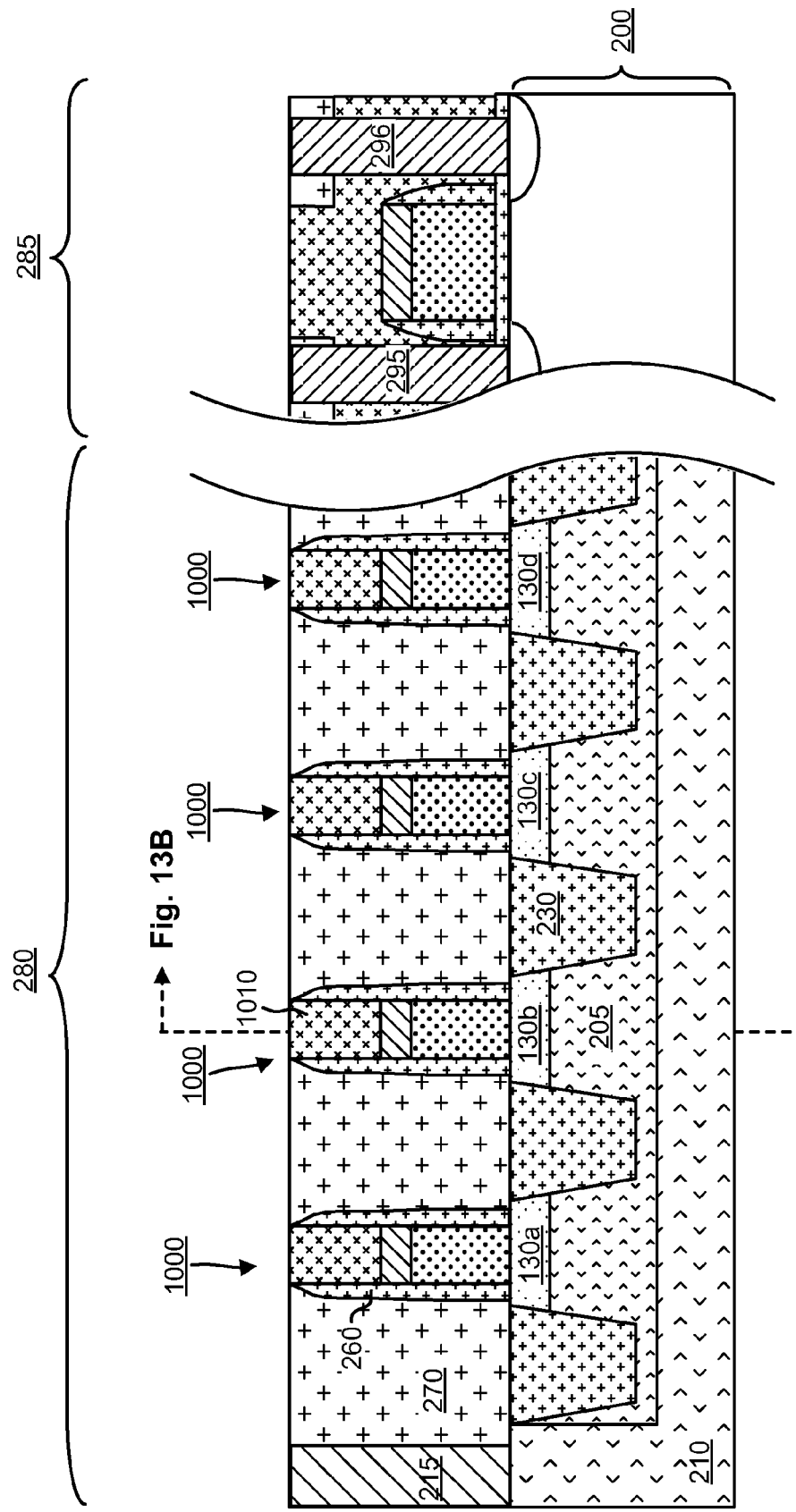
Figure 13B:
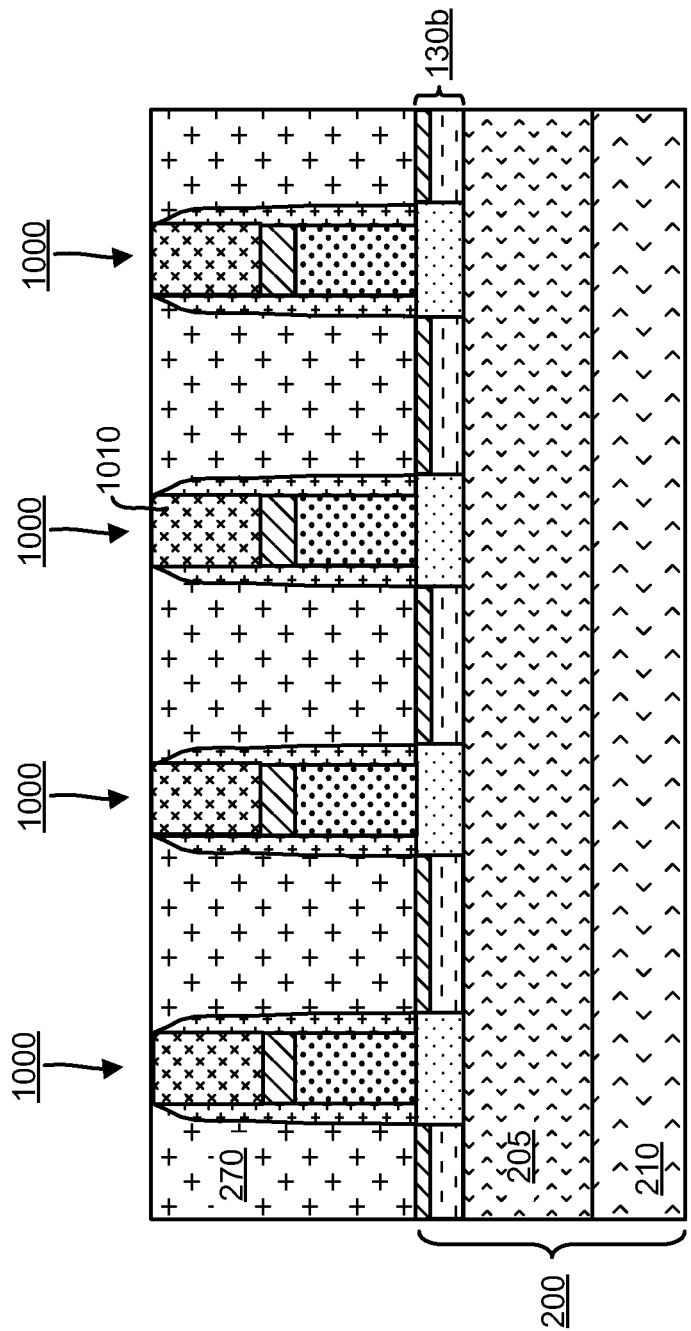

Next, an array of conductive contacts 215 are formed through the dielectric 260 to contact the second doped region 210 of the well and conductive pillars 295, 296 are formed to contact doped regions 288 and 289 respectively, resulting in the structure illustrated in FIGS. 13A and 13B.

Figure 14A:
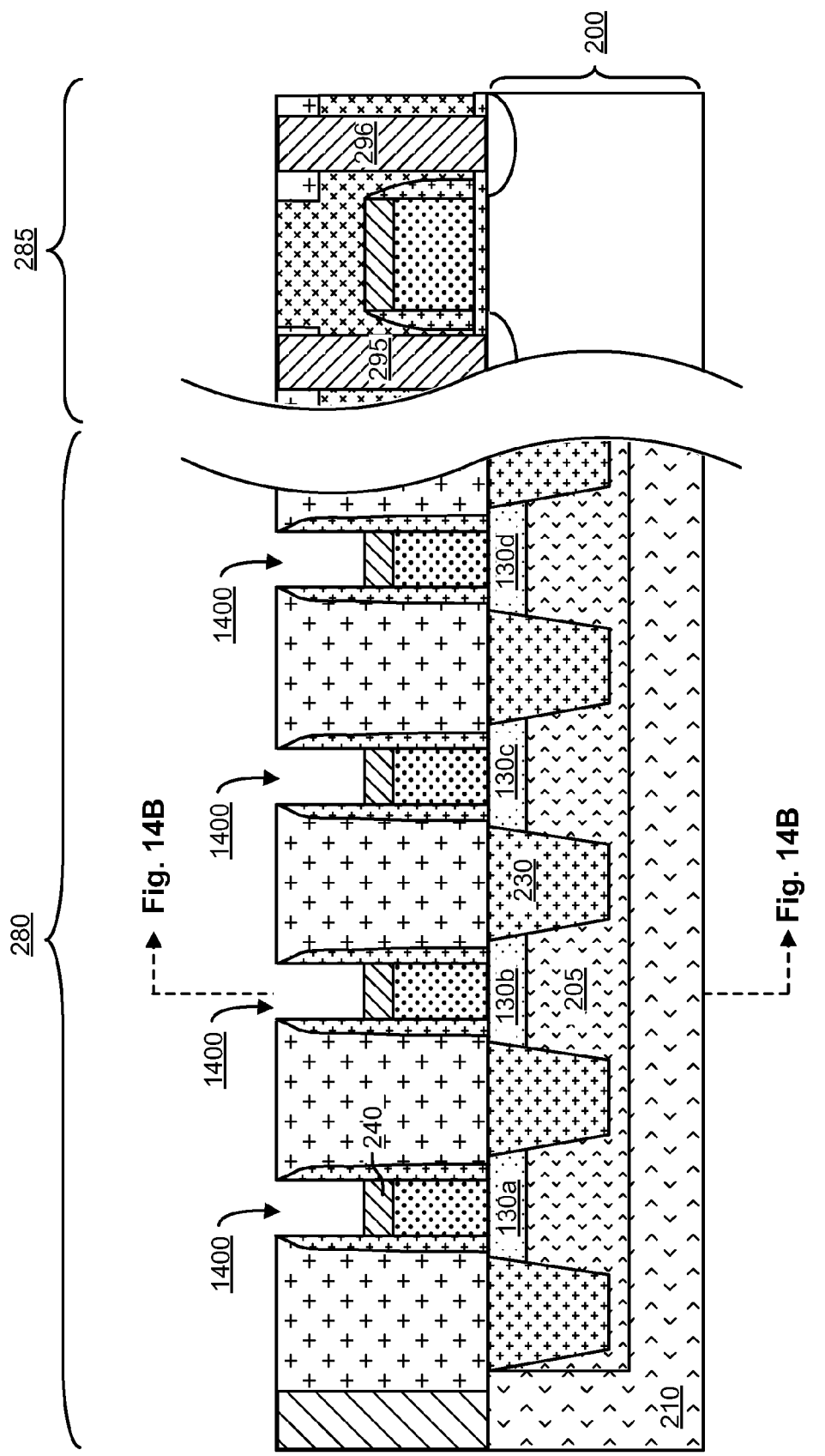
Figure 14B:
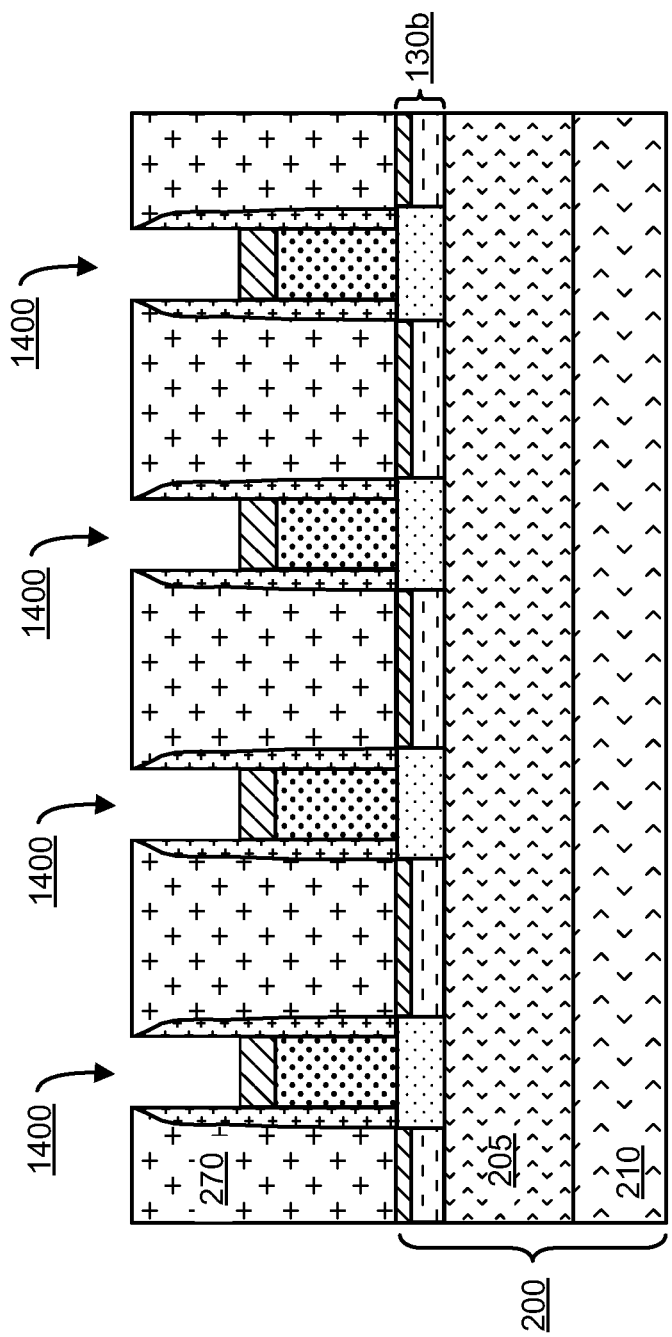

Next, the sacrificial elements 1010 of FIGS. 13A-13B are removed to form vias 1400 defined by the spacers 260 and extending down to the conductive caps 240, resulting in the structure illustrated in FIGS. 14A and 14B.

Figure 15A:
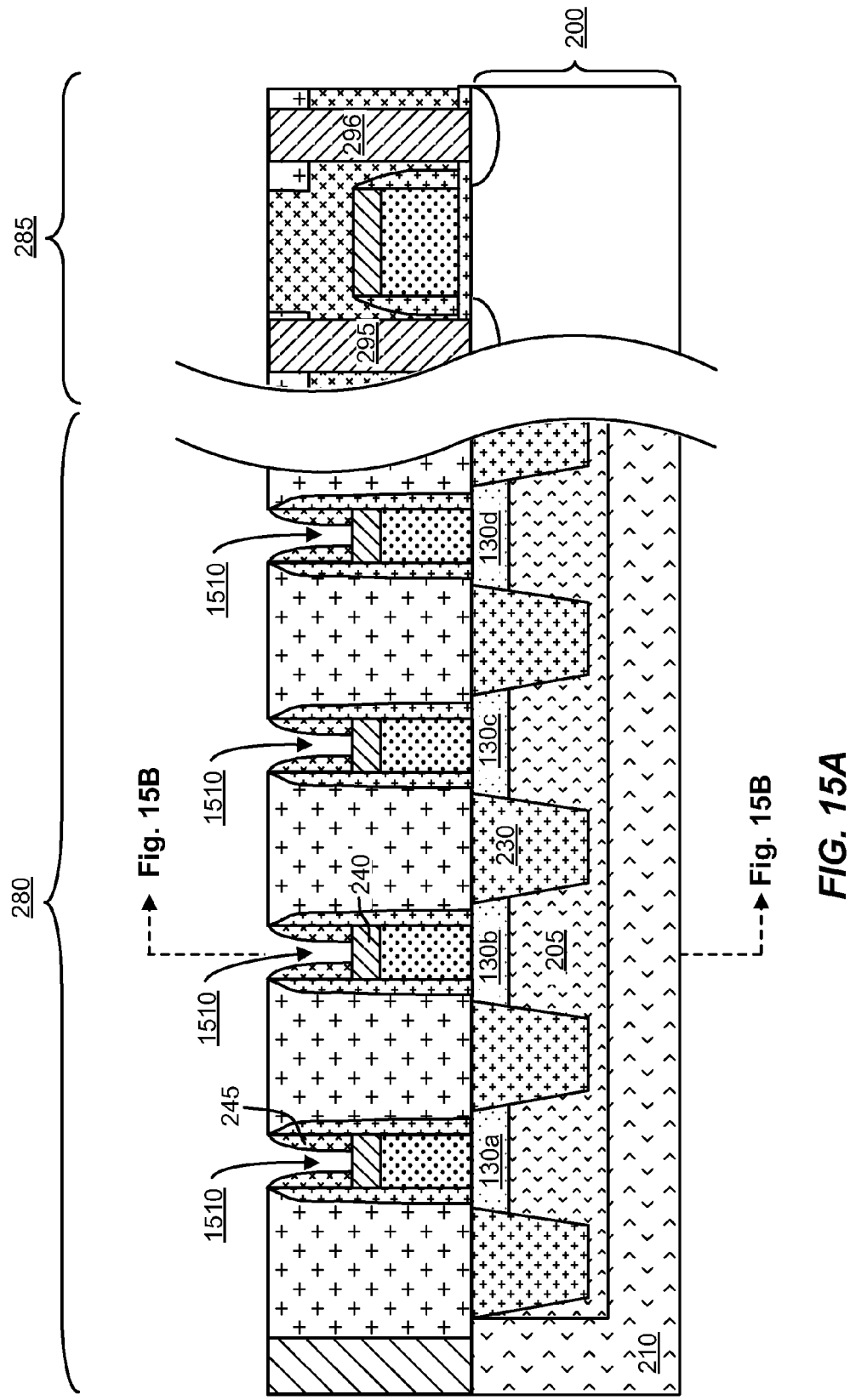
Figure 15B:
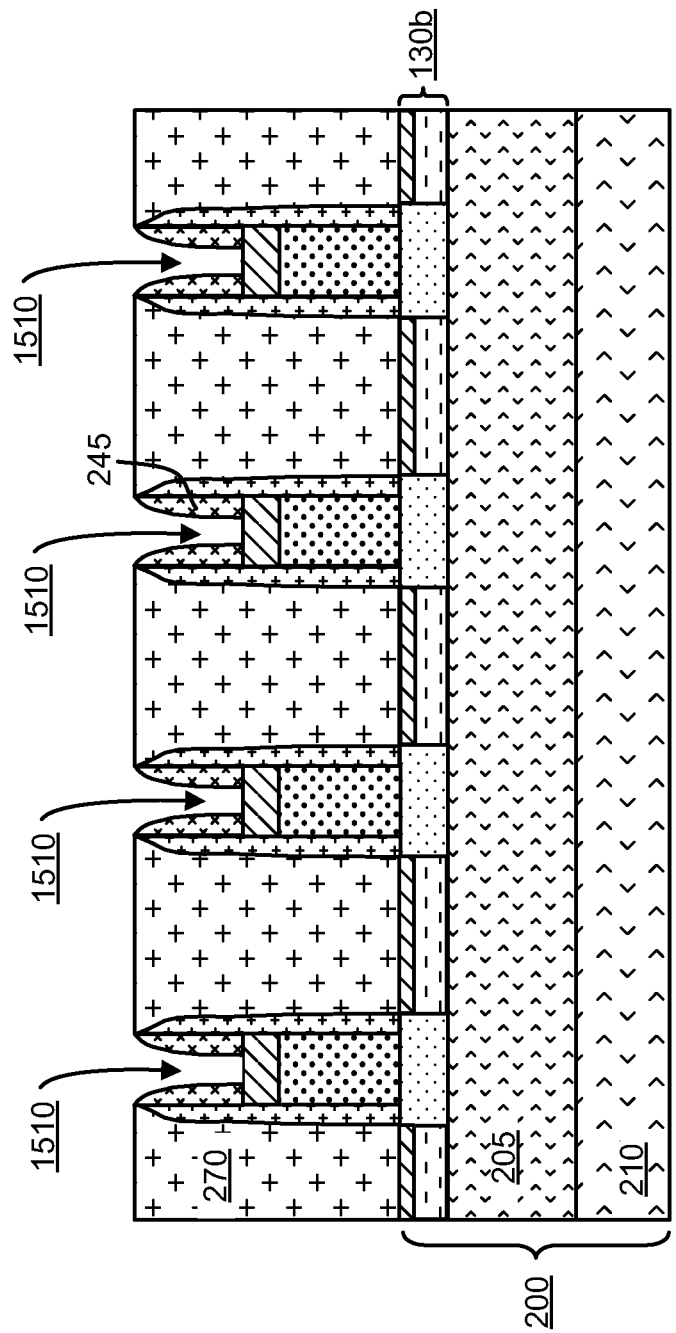

Next, insulating elements 245 are formed within the vias 1400 of FIGS. 14A-14B, resulting in the structure illustrated in FIGS. 15A-15B. The insulating elements 245 define self-centered openings 1510 within the vias 1400, and in the illustrated embodiment the insulating elements 245 comprise silicon nitride.

The insulating elements 245 may be formed by forming an insulating dielectric material layer on the structure illustrated in FIGS. 14A-14B, and anisotropically etching the dielectric material layer to expose a portion of the conductive caps 240.

The insulating elements 245 may alternatively be formed by forming a material layer on the top surface of the dielectric 270 and having openings overlying the vias 1400. A selective undercutting etch is then performed on the vias 1400 such that the spacers 260 are etched while leaving the material layer on the top surface of the dielectric 270 intact. Insulating layer material is in then formed in the via 1400, which due to the selective undercutting etch process results in a self-aligned void in the insulating layer material being formed within the via 1400. Next, an anisotropic etching process is performed on the insulating layer material to open the void, and etching continues until a portion of the top surface of the conductive cap 240 is exposed in the region below the void, thereby forming the insulating element 245 comprising insulating layer material within the void 1400.

Figure 16A:
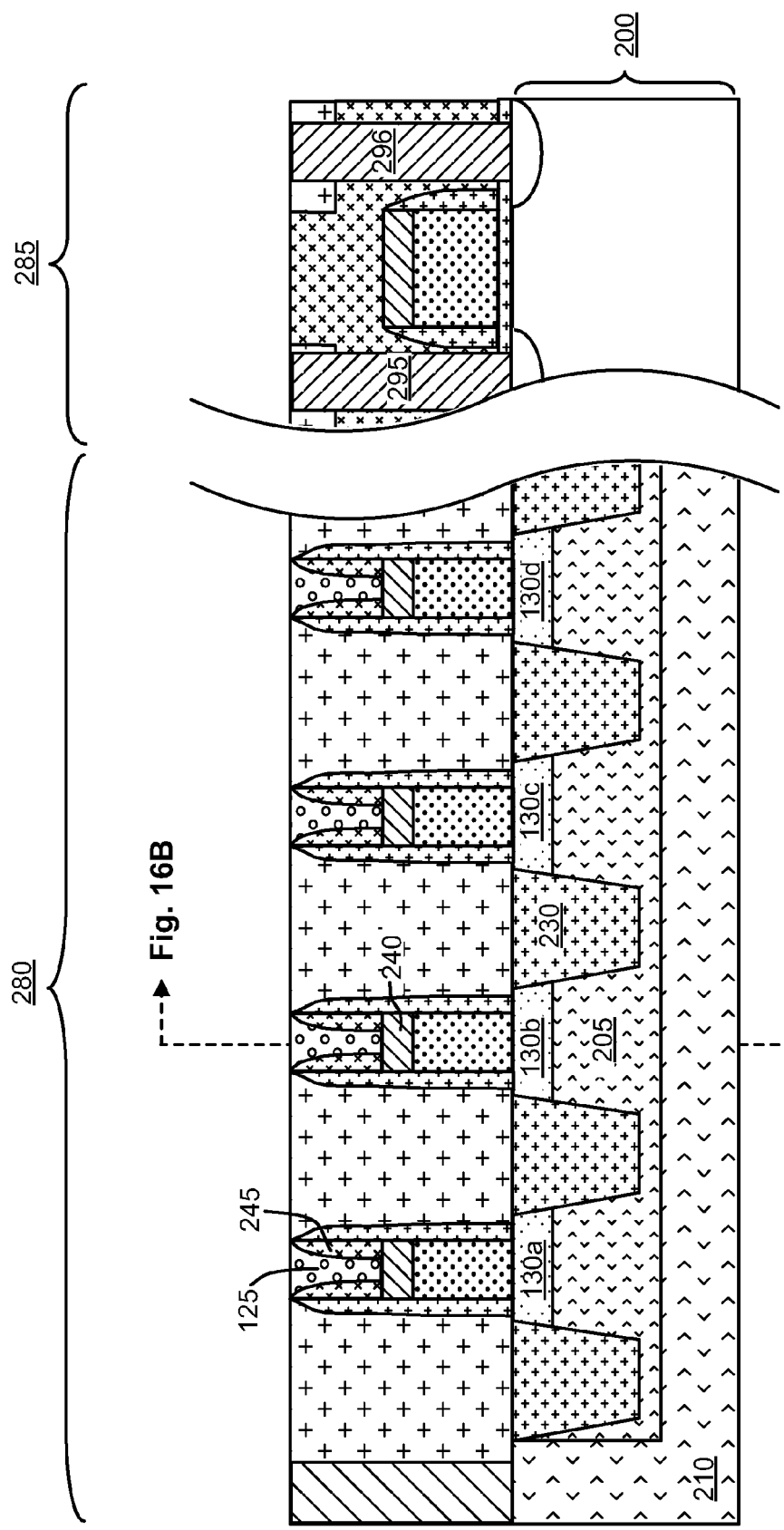
Figure 16B:
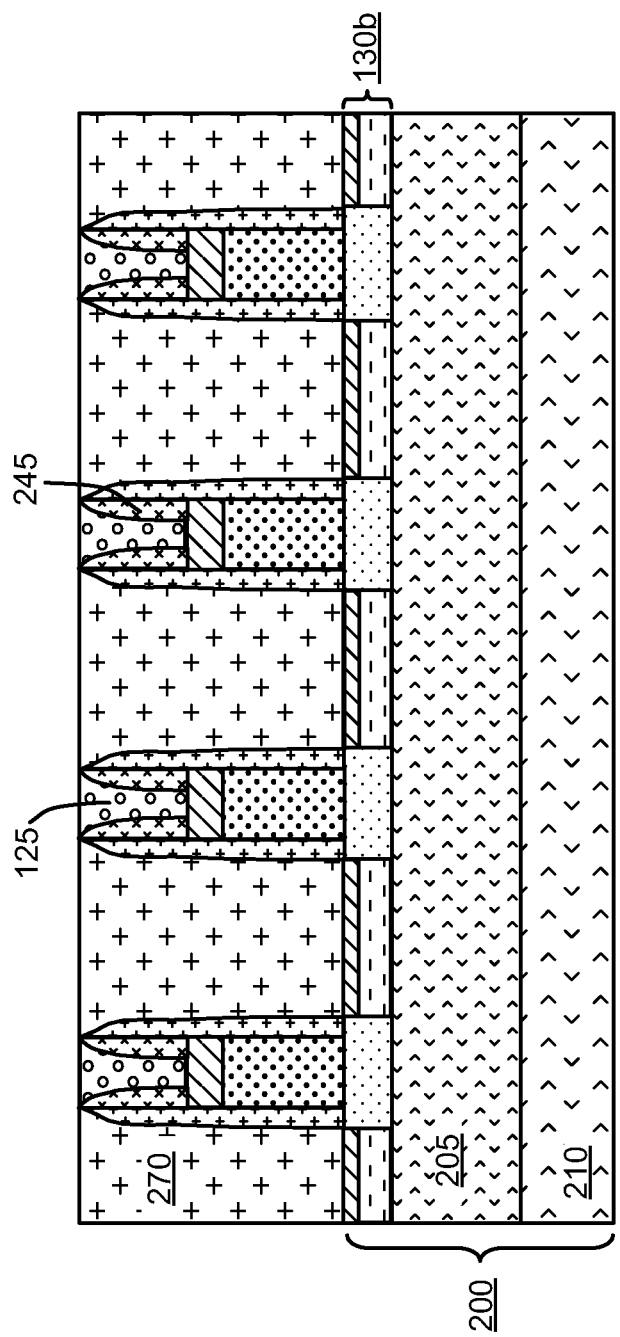

Next, the memory elements 125 are formed within the openings 1510 defined by the insulating elements 245 of the structure illustrated in FIGS. 15A-15B, resulting in the structure illustrated in FIGS. 16A-16B. The memory elements 125 may be formed by deposition of memory material on the structure illustrated in FIGS. 15A-15B, followed by a planarization process such as CMP.

Figure 17A:
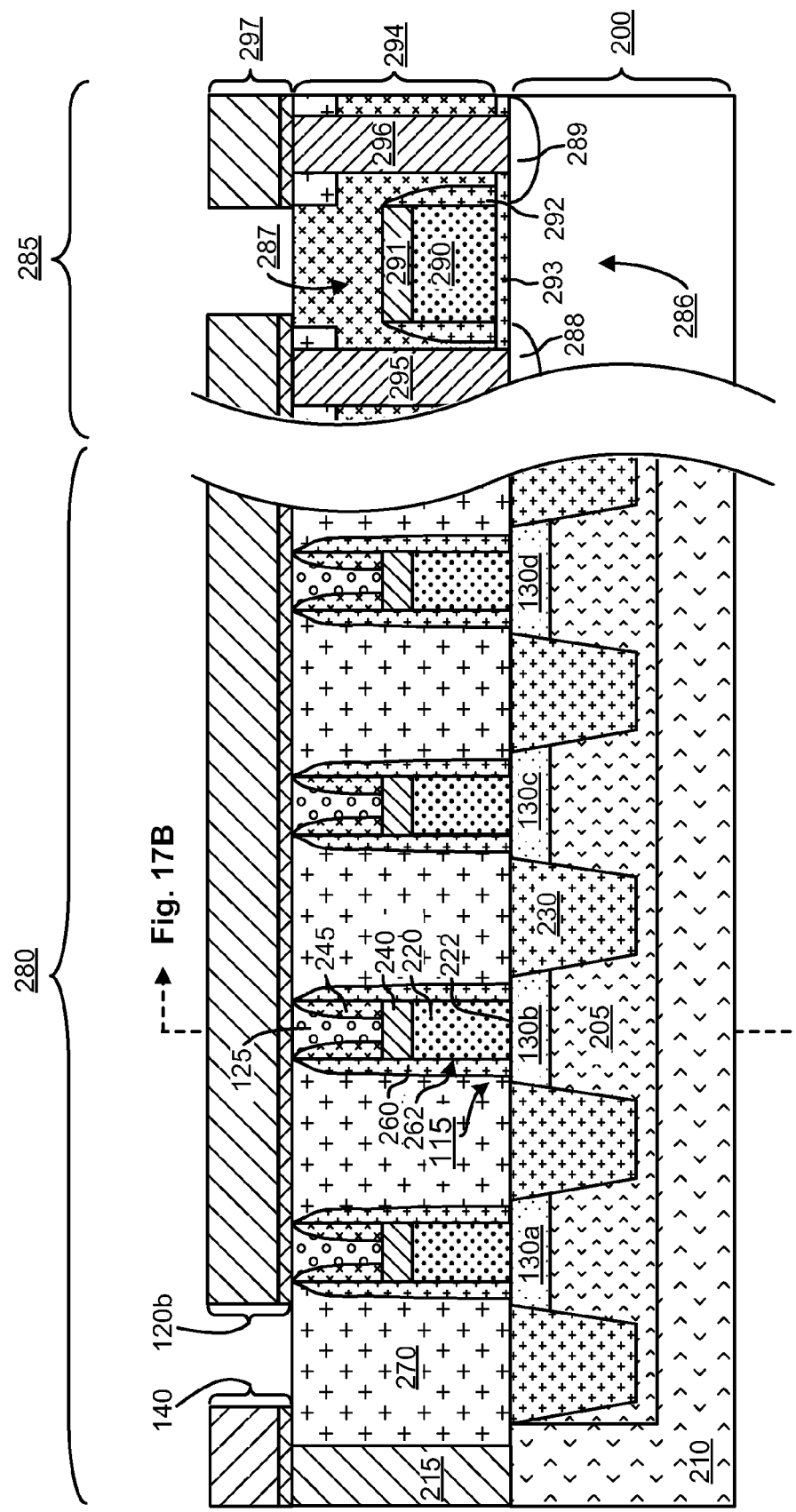
Figure 17B:
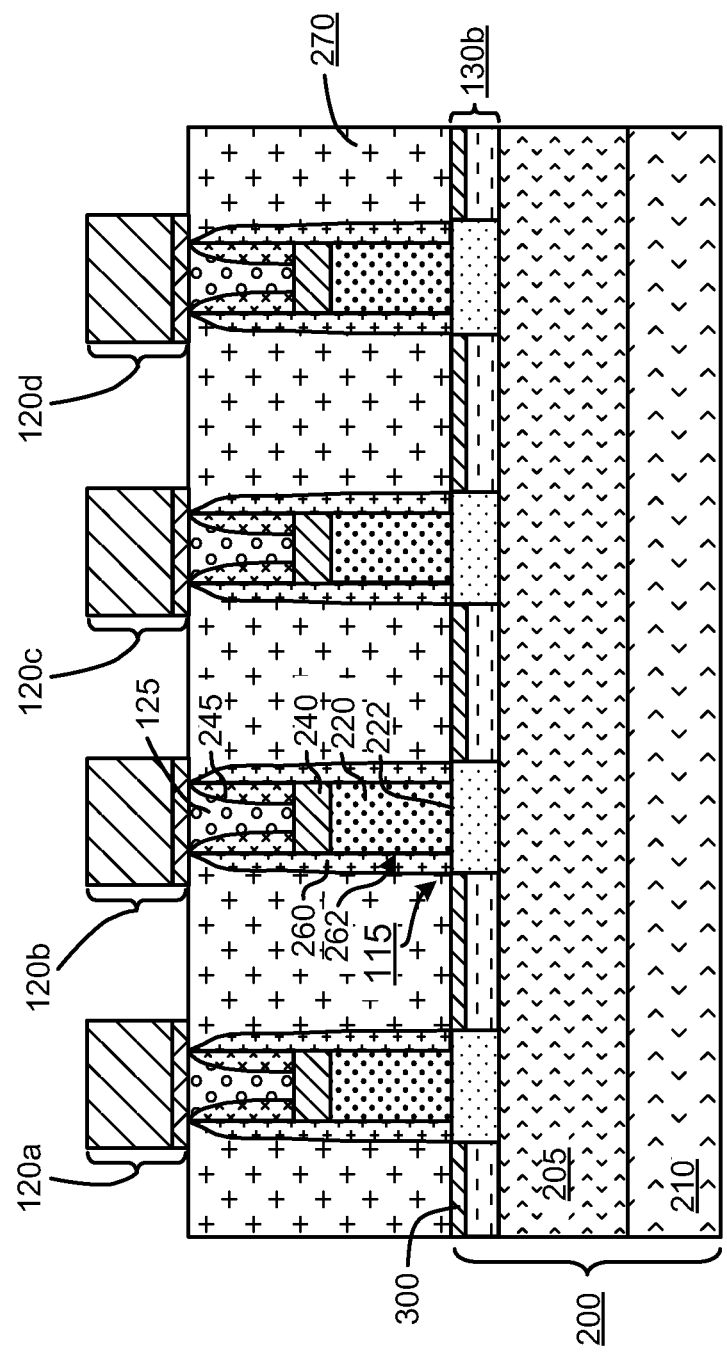

Next, the bit lines 120, conductive material 140 coupled to a reference voltage, and line 297 are formed on the structure illustrated in FIGS. 16A-16B, resulting in the structure illustrated in FIGS. 17A-17B. In the illustrated embodiment the bits lines 120, conductive material 140, and line 297 comprise first and second conductive layers and are formed by depositing the first and second conductive layers and patterning the layers.

As described above, the doped polysilicon pillars 220 and conductive caps 240 are formed during the formation of sacrificial elements 1010 which define the locations of the subsequently formed insulating elements 245 and memory elements 125. The spacers 260 are then formed and the sacrificial elements 1010 are selectively removed to form vias 1400 defined by the spacers 260 and overlying the conductive caps 240. The insulating elements 245 are then formed within the vias 1400 and have openings centered within the cylinder defined by the sides of the emitter, and the memory element 125 is formed within an opening 1510 defined by the insulating element 245. Thus, the memory elements are centered on and self-aligned to the doped polysilicon pillars 220 and the conductive caps 240, the doped polysilicon pillars 220 and conductive caps 240 acting as the emitters of the bipolar junction transistors of the memory cells.

Since the logic devices in the periphery region and the memory cells having bipolar junction transistors in the memory region are manufactured concurrently in the manufacturing steps described, the memory device has a reduced complexity and addresses the compatibility of design integration issues discussed above, thereby reducing the cost. As described above, bipolar junction transistors can provide larger current drive than field effect transistors. Additionally, since the emitters of the transistors comprise doped polysilicon material a relatively large current gain can be obtained, which reduces the amount of current needed on the word lines 130 to induce the phase change in the memory elements. The reduced amount of current on the word lines 130 reduces the cross-talk between devices sharing the same word line, thus improving the performance of the array.

FIGS. 18-21 illustrate an alternative embodiment to that illustrated in FIGS. 5A-5B for forming word lines 130.

Figure 18:
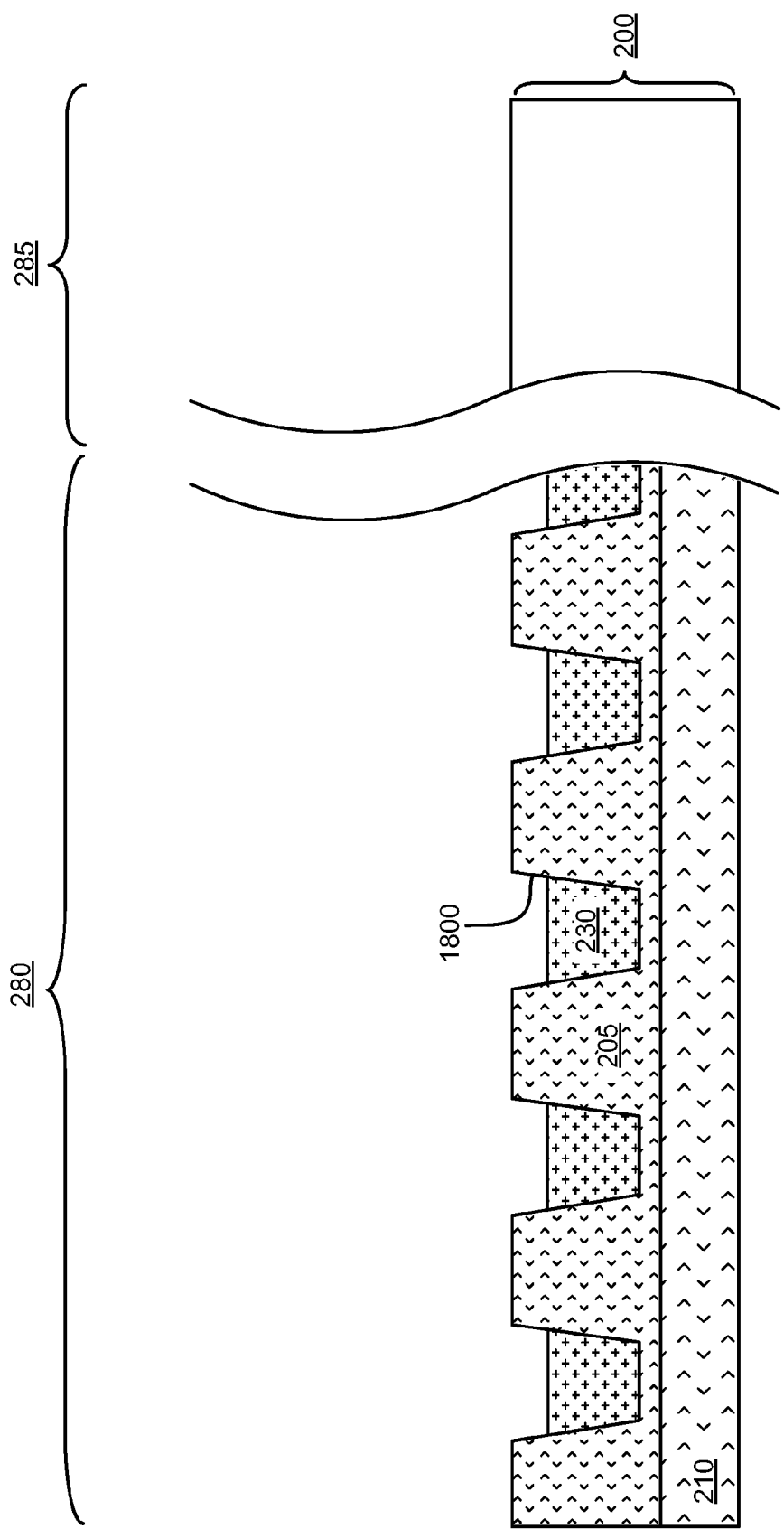
FIGS. 18-21 illustrate an alternative embodiment to that illustrated in FIGS. 5A-5B for forming word lines.

As illustrated in the cross-sectional view of FIG. 18, etching is performed to remove a portion of the dielectric material of the dielectric trenches 230 of FIG. 4, thereby exposing sidewall surfaces 1800 of first doped region 205 of the well between the dielectric trenches 230.

Figure 19:
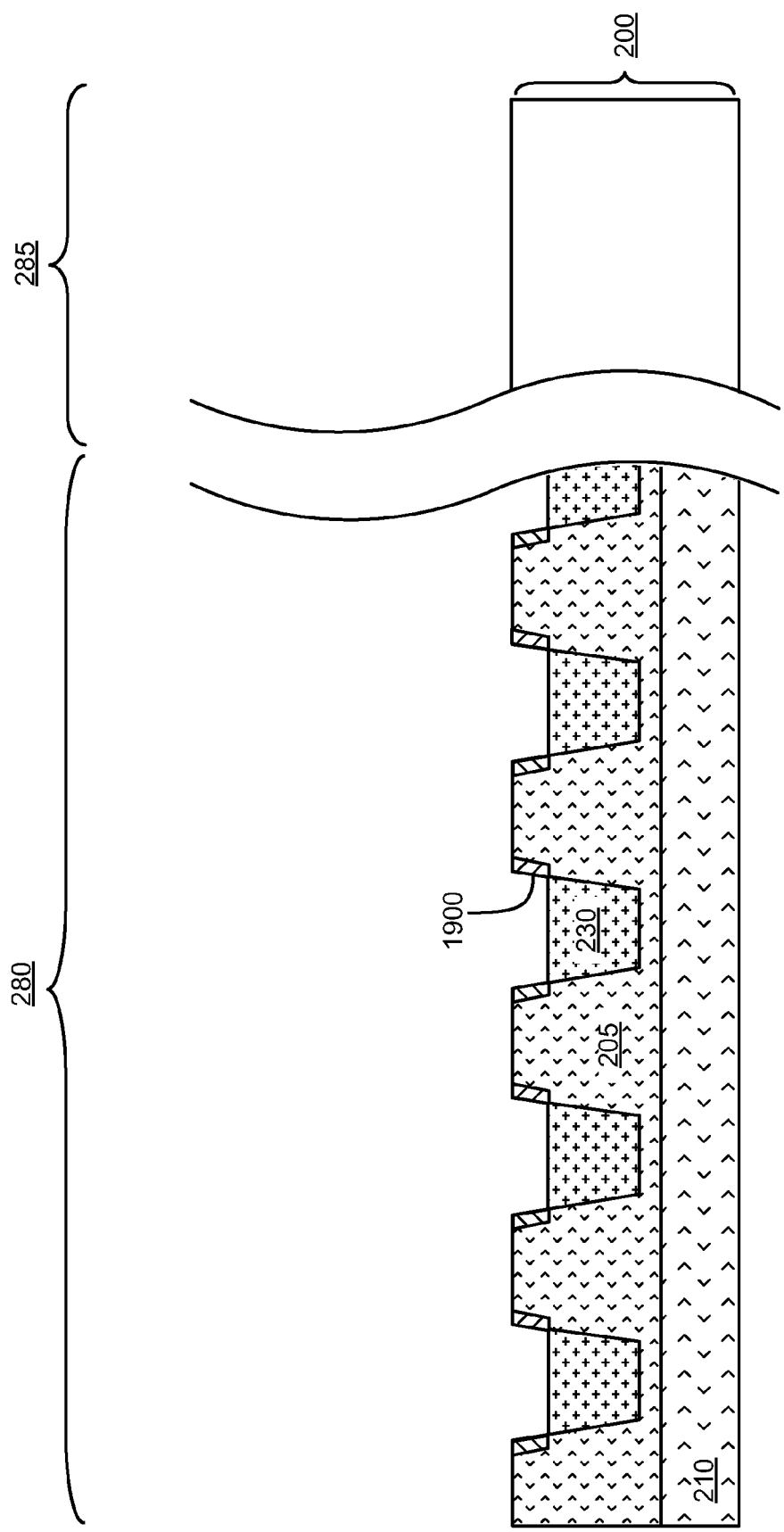

Next, sidewall conductors 1900 are formed on the exposed sidewall surfaces 1800 of the first doped region 205 of the well of FIG. 18, resulting in the structure illustrated in the cross-sectional view of FIG. 19. The sidewall conductors 1900 comprise a silicide containing, for example, Ti, W, Co, Ni, or Ta. The sidewall conductors 1900 can be formed by depositing a silicide precursor on the exposed sidewall surfaces 1800 and annealing to cause silicide formation. Then the remaining silicide precursor on the substrate is removed, leaving the self-aligned silicide sidewall conductors on the sides of sidewall surfaces 1800. Typical silicide precursors include metals or combinations of metals such as cobalt, titanium, nickel, molybdenum, tungsten, tantalum, and platinum. Also, silicide precursors may include metal nitrides or other metal compounds. The resulting silicide sidewall conductors 1900 removes minority carriers from the word lines and improves conductivity of the word lines 130.

Figure 20:
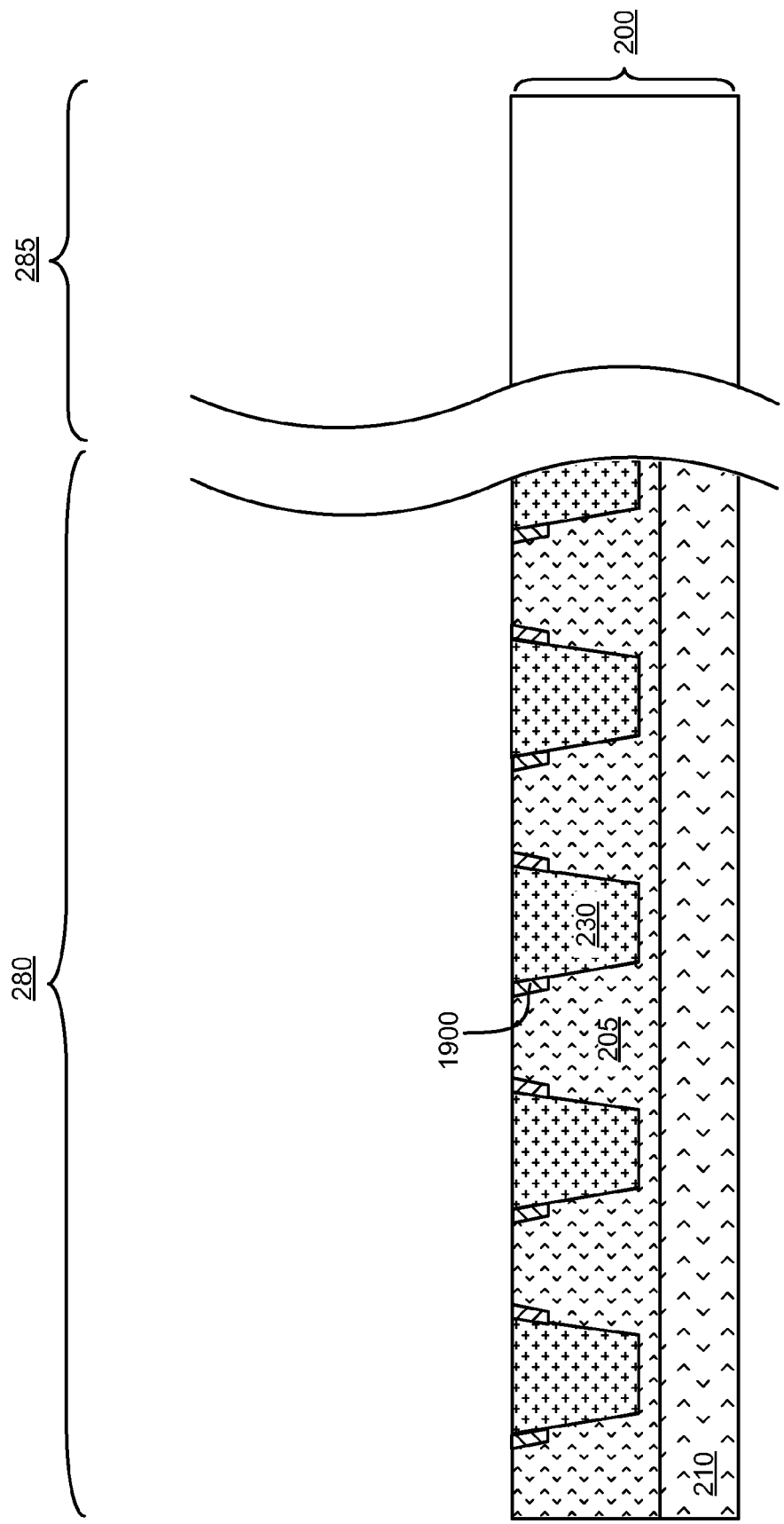

Next, dielectric material is formed on the structure illustrated in FIG. 19 to fill the dielectric trenches 230, resulting in the structure shown in the cross-sectional view of FIG. 20.

Next, ion implantation is performed to implant dopants to form word lines 130, the word lines 130 having a conductivity type opposite that of the first and second doped regions 205 and 210 of the well and resulting in the structure illustrated in the cross-sectional view of FIG. 21.

Figure 22:
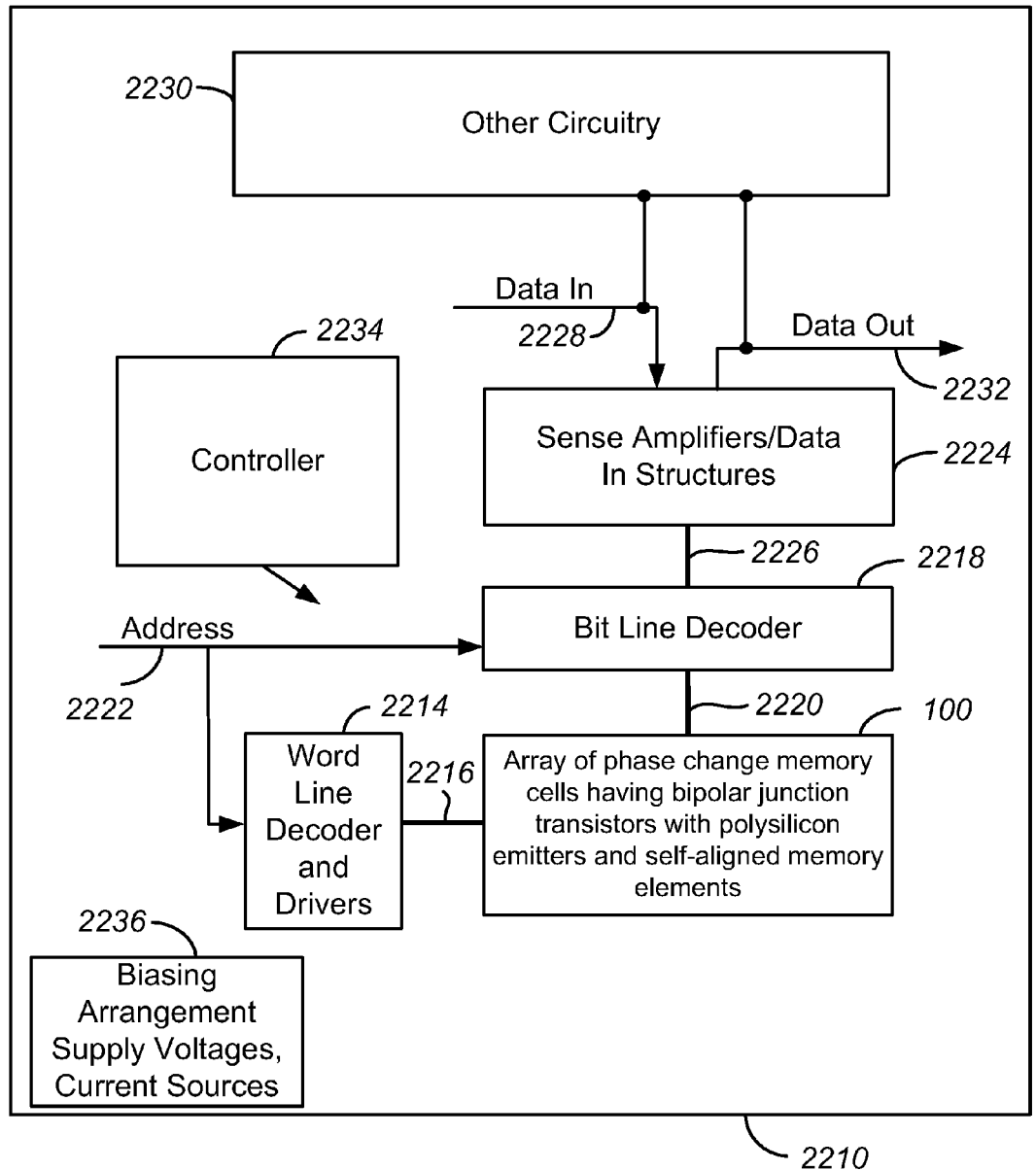
FIG. 22 is a simplified block diagram of an integrated circuit including a memory array implemented using memory cells having bipolar junction transistors with polysilicon emitters and self-aligned memory elements as described herein.

FIG. 22 is a simplified block diagram of an integrated circuit 2210 including a memory array 100 implemented using memory cells having bipolar junction transistors with polysilicon emitters and self-aligned memory elements as described herein. A word line decoder 2214 having read, set and reset modes is coupled to and in electrical communication with a plurality of word lines 2216 arranged along rows in the memory array 100. A bit line (column) decoder 2218 is in electrical communication with a plurality of bit lines 2220 arranged along columns in the array 100 for reading, setting, and resetting the phase change memory cells (not shown) in array 100. Addresses are supplied on bus 2222 to word line decoder and drivers 2214 and bit line decoder 2218. Sense amplifiers and data-in structures in block 2224, including voltage and/or current sources for the read, set, and reset modes are coupled to bit line decoder 2218 via data bus 2226. Data is supplied via a data-in line 2228 from input/output ports on integrated circuit 2210, or from other data sources internal or external to integrated circuit 2210, to data-in structures in block 2224. Other circuitry 2230 may be included on integrated circuit 2210, such as a general purpose processor or special purpose application circuitry, or a combination of modules providing system-on-a-chip functionality supported by array 100. Data is supplied via a data-out line 2232 from the sense amplifiers in block 2224 to input/output ports on integrated circuit 2210, or to other data destinations internal or external to integrated circuit 2210.

A controller 2234 implemented in this example, using a bias arrangement state machine, controls the application of bias arrangement supply voltages and current sources 2236, such as read, program, erase, erase verify and program verify voltages and/or currents. Controller 2234 may be implemented using special-purpose logic circuitry as known in the art. In alternative embodiments, controller 2234 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 2234.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device comprising a plurality of memory cells, memory cells in the plurality of memory cells respectively comprising:
   a bipolar junction transistor comprising an emitter, a base and a collector, the emitter comprising a pillar of doped polysilicon, the base being coupled to a word line, the pillar of doped polysilicon being more highly doped than the base and the collector being more highly doped than the base;
   an insulating element over the emitter and having an opening extending through the insulating element, the opening centered over and more narrow than, the pillar of doped polysilicon; and
   programmable resistance memory material within the opening and electrically coupled to the emitter
   wherein the plurality of word lines further comprise silicide on surfaces between the bases of bipolar junction transistors of adjacent memory cells of the plurality of memory cells.

2. The memory device of claim 1, wherein:
   the pillar of doped polysilicon has sides that, when projected above over the emitter, define a cylinder over the emitter; and
   the opening is centered within the cylinder.

3. The memory device of claim 1, wherein the programmable resistance memory material has a bottom surface with a surface area less than that of a top surface of the emitter.

4. The memory device of claim 1, wherein the emitter comprises a conductive cap comprising silicide on the pillar of doped polysilicon.

5. The device of claim 1, wherein the insulating element has an outer surface vertically aligned with an outer surface of the emitter.

6. The device of claim 1, wherein the memory cells in the plurality of memory cells respectively further comprise a sidewall spacer surrounding the insulating element and the emitter.

7. The device of claim 1, further comprising a single-crystalline semiconductor substrate and a plurality of word lines within the single-crystalline semiconductor substrate, wherein the base comprising a portion of one of the plurality of word lines; and
   the collector comprising a portion of the single-crystalline substrate underlying the base and having a conductivity type opposite that of the plurality of word lines.

8. The device of claim 7, further comprising sidewall conductors comprising silicide on sidewall surfaces of the word lines.

9. The device of claim 7, wherein:
   the collector comprises n-type doped semiconductor material;
   the word lines comprise p-type doped semiconductor material; and
   the emitters of the memory cells comprise n-type doped polysilicon.

10. The device of claim 7, wherein:
    the single-crystalline substrate comprises p-type doped semiconductor material;
    the word lines comprise n-type doped semiconductor material; and
    the emitters of the memory cells comprise p-type doped polysilicon.

11. The device of claim 7, further comprising a plurality of bit lines, wherein the memory elements of the respective memory cells are electrically coupled between the emitter and a corresponding bit line in the plurality of bit lines.

12. The device of claim 11, further comprising conductive contacts contacting the single-crystalline substrate and coupled to a reference voltage.

* * * * *